United States Patent [19]

New et al.

[11] Patent Number: 5,481,206

[45] Date of Patent: Jan. 2, 1996

[54] CIRCUIT FOR FAST CARRY AND LOGIC

[75] Inventors: Bernard J. New, Los Gatos, Calif.; Kerry M. Pierce, Canby, Oreg.

[73] Assignee: Xilinx, Inc., San Jose, Calif.

[21] Appl. No.: 310,113

[22] Filed: Sep. 20, 1994

Related U.S. Application Data

[63] Continuation-in-part of Ser. No. 116,659, Sep. 2, 1993, Pat. No. 5,349,250.

[51] Int. Cl.[6] .................................................... H03K 19/20
[52] U.S. Cl. ............................. 326/38; 326/39; 326/41; 365/189.08
[58] Field of Search ................................. 326/38, 39, 41; 327/407; 365/189.08

[56] References Cited

U.S. PATENT DOCUMENTS

| | | | |
|---|---|---|---|
| 4,124,899 | 11/1978 | Birkner et al. | 364/716 |
| 4,706,216 | 11/1987 | Carter | 365/94 |
| 4,758,745 | 7/1988 | Elgamal et al. | 307/465 |
| 4,870,302 | 9/1989 | Freeman | 307/465 |
| 5,198,705 | 3/1993 | Galbraith et al. | 307/465 |
| 5,258,668 | 11/1993 | Cliff et al. | 307/465 |
| 5,260,611 | 11/1993 | Cliff et al. | 307/465 |
| 5,267,187 | 11/1993 | Hsieh et al. | 364/784 |
| 5,280,202 | 1/1994 | Chan et al. | 307/465 |
| 5,287,472 | 2/1994 | Horst | 365/189.08 X |
| 5,332,929 | 7/1994 | Chiang | 365/189.08 X |
| 5,352,940 | 10/1994 | Watson | 365/189.08 X |

OTHER PUBLICATIONS

Xilinx Programmable Gate Array Data Book, 1989, pp. 6–30 through 6–44, available from Xilinx, Inc., 2100 Logic Drive, San Jose, California 95124.

*Primary Examiner*—David C. Nelms
*Assistant Examiner*—Son Mai
*Attorney, Agent, or Firm*—Edel M. Young

[57] ABSTRACT

Programmable logic devices which include multiple blocks of combinatorial function generators and storage elements, and which are interconnected by a programmable interconnect structure are used, among other things for performing arithmetic functions which use logic for generating the carry function. When a large number of bits is to be processed, the carry function typically causes significant delay or requires significant additional components to achieve a result at high speed. The present invention provides dedicated hardware within the logic blocks for performing the carry function quickly and with a minimum number of components. The circuit includes additional structures to allow the fast carry hardware to perform additional commonly used functions.

2 Claims, 24 Drawing Sheets

Schematic Symbol For Full Adder

KEY TO FIGURE 4

| FIG. 4a | FIG. 4c |
| --- | --- |
| FIG. 4b | FIG. 4d |

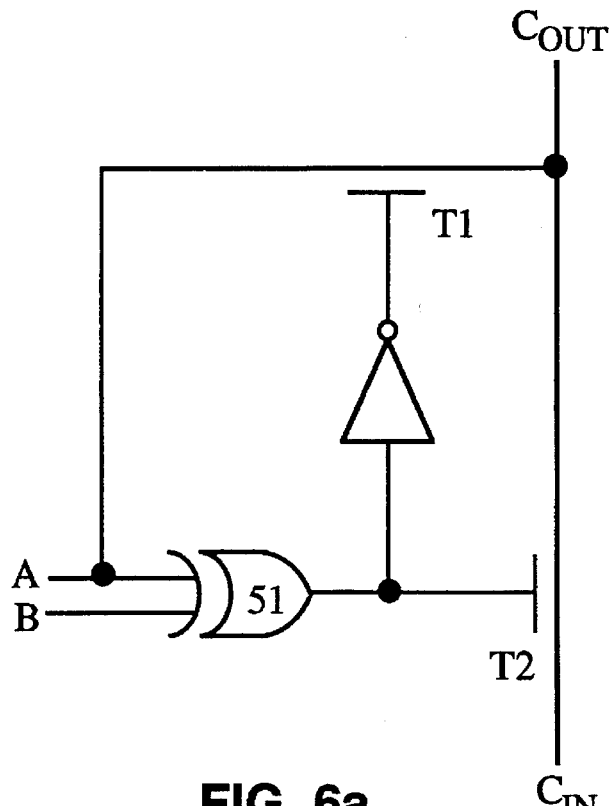
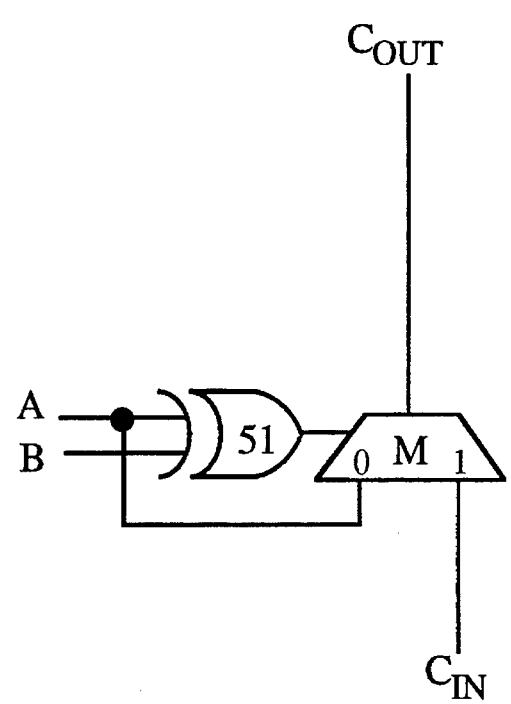
FIG. 6a
(Prior Art)
FIG. 6b
(Prior Art)
|   | A | B | $C_{IN}$ | $C_{OUT}$ |
|---|---|---|---|---|
| 1 | 0 | 0 | 0 | 0 |
| 2 | 0 | 0 | 1 | 0 |
| 3 | 0 | 1 | 0 | 0 |
| 4 | 1 | 0 | 0 | 0 |
| 5 | 0 | 1 | 1 | 1 |
| 6 | 1 | 0 | 1 | 1 |
| 7 | 1 | 1 | 0 | 1 |
| 8 | 1 | 1 | 1 | 1 |
FIG. 6c
(Prior Art)

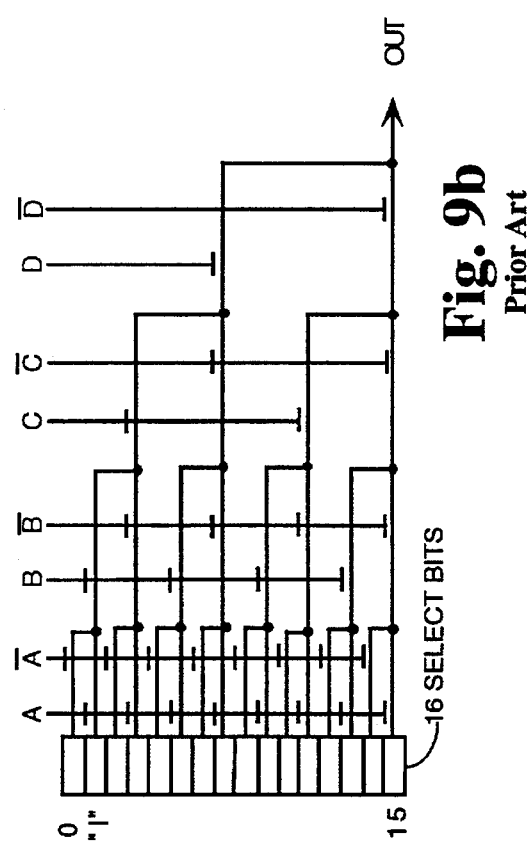
Fig. 9b Prior Art
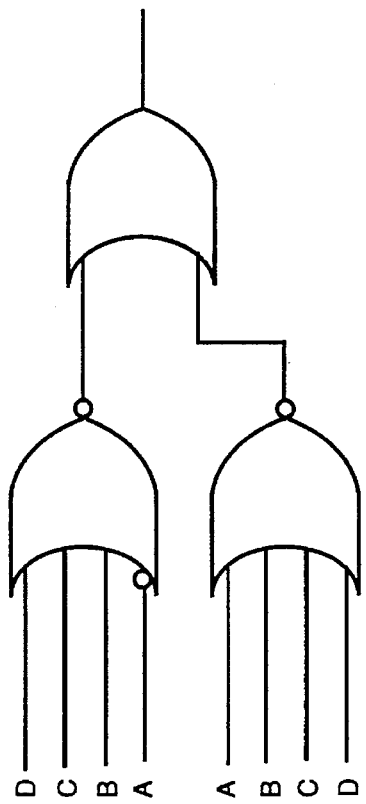
Fig. 9d Prior Art
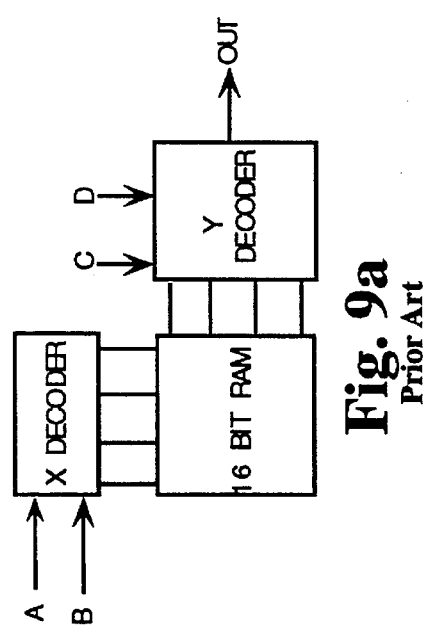
Fig. 9a Prior Art
Fig. 9c Prior Art

| NW | N | N | N | N | N | N | N | N | NE |
|----|---|---|---|---|---|---|---|---|----|
| W | C | C | C | C | C | C | C | C | E |
| W | C | C | C | C | C | C | C | C | E |
| W | C | C | C | C | C | C | C | C | E |
| W | C | C | C | C | C | C | C | C | E |
| W | C | C | C | C | C | C | C | C | E |
| W | C | C | C | C | C | C | C | C | E |
| W | C | C | C | C | C | C | C | C | E |
| W | C | C | C | C | C | C | C | C | E |
| SW | S | S | S | S | S | S | S | S | SE |

CIRCUIT FOR FAST CARRY AND LOGIC

CONTINUATION INFORMATION

This is a continuation-in-part of U.S. patent application Ser. No. 08/116,659 filed Sep. 2, 1993, issued as U.S. Pat. No. 5,349,250 on Sep. 20, 1994.

FIELD OF THE INVENTION

This invention relates to large integrated circuits, more particularly to programmable or configurable logic devices.

BACKGROUND

One kind of function performed in programmable logic devices is arithmetic. A device such as a configurable logic array of Xilinx, Inc., assignee of the present invention, can perform arithmetic as well as a multitude of other logic functions. Such devices are described in U.S. Pat. Nos. 4,870,302 and 4,706,216, and U.S. Pat. No. 5,343,406, which are incorporated herein by reference. Because these devices are intended for general purpose functions, arithmetic is relatively slow and requires a significant amount of silicon area.

Other programmable logic devices, such as the programmable array logic device described in Birkner, U.S. Pat. No. 4,124,899 and user programmable devices described in Elgamal et al, U.S. Pat. No. 4,758,745 can also be programmed to perform arithmetic. These two patents are also incorporated by reference. In these devices the speed of performing arithmetic and other functions which use carry logic is limited by propagation of the carry signal. Also, the general purpose logic used to implement the carry function is significant.

For understanding how logic devices perform arithmetic, and particularly what causes delay, the following discussion of arithmetic functions will focus on adders. However, the discussion can easily be extended to apply to subtractors, incrementers, decrementers, and accumulators, in addition to other circuits which use a carry-logic.

The following discussion will focus on operation of the middle stages in a multi-bit adder. The least significant bit is a special case because there can be no carry signal to be received from a less significant bit. The most significant bit is a special case because the carry bit can be used for determining an overflow condition. These two special cases will be discussed in detail later.

By reference to FIGS. 1a, 1b and 2, it will be explained how the speed of a single bit ripple carry adder (FIGS. 1a and 1b), and thus a multi-bit ripple carry adder constructed by cascading single bit adders (FIG. 2) is constrained by the speed at which the signal at the carry-in terminal is propagated to the carry-out terminal.

The Boolean logic equations governing the behavior of the single bit adder shown in FIG. 1a are:

$$S_i = (A_i @ B_i) @ C_i \quad (1)$$

$$C_{i+1} = A_i \cdot B_i + (A_i @ B_i) \cdot C_i \quad (2)$$

where @ represents the exclusive-or (XOR) function, · represents the AND function, and + represents the OR function.

Eq. (1) shows that the sum is a function of a carry-in from a less significant bit in addition to the single bits $A_i$ and $B_i$ being added. The ripple carry adder algorithm of Eqs. (1) and (2) shows that the sum for a particular bit cannot be calculated until the carry-out from the previous bit is available. The sum $S_i$ is the output of an XOR gate and cannot be generated until each of its inputs, one of which is the carry-in signal $C_i$, is available.

Furthermore, the carry-out $C_{i+1}$ also cannot be generated until the less significant carry bit $C_i$ is available. Referring now to FIG. 2, the propagation of the carry signal through successive stages of a ripple carry adder will be explained. AND gate 67 in the second adder stage Add$_{i+1}$ receives one of its inputs from the output of XOR gate 66 after only 1 gate delay. However, assuming that the carry-in signal $C_i$ is preset (that is, that Add$_i$ is the least significant bit), AND gate 67 could wait an additional 3 gate delays for the effect of $A_i$ and $B_i$ to propagate through gates 61, 62 and 65 before its other input, the carry-out $C_{i+1}$ from the less significant bit, has been generated from the carry out of the less significant bit $C_i$ and the less significant bits $A_i$ and $B_i$ to be added. Furthermore, the carry-out $C_{i+2}$ of the second bit Add$_{i+1}$ is further delayed through 2 more gates after the carry bit $C_{i+1}$ has been generated. That is, combining the inputs on $A_{i+1}$ and $B_{i+1}$ with the carry in signal $C_{i+1}$ to generate $C_{i+2}$ requires that $C_{i+1}$ propagate through AND gate 67 and OR gate 70. Thus, there will not be a valid carry-in signal $C_{i+2}$ for input to a third stage until 5 gate delays after the application of the input signals $A_i$ and $B_i$. Thus, the speed of the conventional ripple carry adder is constrained by the speed of propagation of the carry signal. The propagation delay of a conventional ripple carry adder is $2_{n+1}$ gates where n is the number of stages in the multi-bit adder.

Since addition is the foundation of many other important functions and operations, it has been important to the computer industry to devise faster adder circuits by speeding up the carry propagation time. In general, these methods work by trading component density and complexity for carry propagation speed.

One well-known algorithm which achieves a faster carry propagation speed is called look-ahead carry logic. A circuit for implementing look-ahead carry logic is shown in FIG. 3. Understanding this logic requires the introduction of two new variables:

$$P_i = A_i @ B_i \quad (3)$$

$$G_i = A_i \cdot B_i \quad (4)$$

The variable P is called "carry propagate" because when P is high, carry-in is propagated to carry-out. The variable G is called "carry generate" because when G is high, a carry-out is generated by the bits being added.

Eqs. (1) and (2) can be rewritten in terms of these new variables:

$$S_i = P_i @ C_i \quad (5)$$

$$C_{i+1} = G_i + P_i \cdot C_i \quad (6)$$

With some minor algebraic manipulation, Eq. (6) can be used to write new equations where the carry bit at each level is dependent only on the addends at each level and the least significant carry bit. The following equations are implemented in the four bit adder shown in FIG. 3:

(a) $C_1 = A_0 B_0 = G_0$ (b) $C_2 = G_1 + P_1 C_1 = G_1 + P_1 C_1$ (c) $C_3 = G_2 + P_2 C_2 = G_2 + P_2(G_1 + P_1 C_1) = G_2 + P_2 G_1 + P_2 P_1 C_1$ (d) $C_4 = G_3 + P_3 C_3 = G_3 + P_3(G_2 + P_2 G_1 + P_2 P_1 C_1) = G_3 + P_3 G_2 + P_3 P_2 G_1 + P_3 P_2 P_1 C_1$ (7)

Each $G_i$ and $P_i$ is a function only of $A_i$ and $B_i$ and not of previous carry values, as can be seen in Eqs. 3 and 4. Second, note in Eq. 7b that $C_2$ is calculated as a function of $G_1$, $P_1$, and $C_1$, and that in Eq. 7c, $C_3$ is calculated as a function of $G_2$, $P_2$ and $C_2$. But since $C_2$ has been solved in terms of $C_1$, $C_3$ can also be solved in terms of $C_1$. Attention to Eq. 7d, and the more general Eq. 6 will reveal that each $C_{i+1}$ is a function of several $G_i$'s, $P_i$'s, and $C_1$. As can be seen in FIG. 3, the less significant bit is fed into the next significant bit only for the calculation of the sum, not for the calculation of the carry bit. Since each carry bit is a function of several $G_i$'s, $P_i$'s, and $C_1$, each carry bit is not dependent on the carry-out of any but the least significant bit. Thus the carry propagation delay of the look-ahead carry circuit is independent of the number of bits being added.

Referring still to FIG. 3 and FIG. 1a, the delay from the application of the input signals (A's and B's) to the appearance of a valid signal at the generate outputs ($G_i$'s) and propagate outputs ($P_i$'s) of an adder stage is 1 gate (this can be discerned from FIG. 1a). The delay added in FIG. 3 by the carry restorer portion of the look ahead carry circuitry is 2 gates, which makes a total of a 3-gate delay from the application of the input signals to the adder until the last carry-out bit is available. This relationship is independent of the number of bits being added. For a multibit adder circuit, the delay will be significantly less than the delay of a conventional ripple carry adder circuit. However, as the number of stages is increased, the number of components increases significantly. Look ahead carry logic requires many more components than the conventional ripple carry adder to implement a stage of a multi-bit adder. This illustrates the idea that faster carry-propagation requires higher component density.

FIG. 4 shows another example of circuit components for implementing an adder. The adder of FIG. 4 is very fast, but, like the adder of FIG. 3, uses many components. Again, a faster carry logic requires a higher component density.

Pages 6–30 through 6–44 of Xilinx, Inc., "*The Programmable Gate Array Data Book*," copyright 1989, available from Xilinx, Inc., 2100 Logic Drive, San Jose, Calif. 95124, show a variety of adders and counters which can be implemented in prior art Xilinx programmable logic devices. These pages of the Xilinx data book are incorporated herein by reference. Xilinx, Inc., owner of the copyright, has no objection to copying these pages but otherwise reserves all copyright rights whatsoever. The adder of FIG. 4 is shown on page 6–30 of the Xilinx data book. FIG. 5 shows a counter, also shown on page 6–34 of the Xilinx data book. FIGS. 4 and 5 thus show applications of arithmetic functions performed in early Xilinx devices. In early Xilinx devices, calculating the sum requires one function generator, and calculating the carry function requires another function generator. Typically, two function generators are incorporated in one logic block of a Xilinx prior art configurable logic array.

Thus, in the adder circuits of both FIG. 4 and FIG. 5, and for other Xilinx prior art adder circuits as well, at least two function generators are required for implementing each stage of an adder or counter.

The truth table in FIG. 6c shows the logical relationships between two single bits that are being added, the carry-in bit, and the carry-out bit. A careful analysis of this truth table has revealed a useful pattern. When A and B are equal (lines 1, 2, 7, and 8), the value of the carry-out $C_{out}$ bit is the value of A and of B. When A and B are not equal, on the other hand, (lines 3–6), the value of the carry-out $C_{out}$ bit is the value of the carry-in $C_{in}$ bit. Two equivalent Boolean logic equations can represent this pattern:

$$C_{out}=(A \oplus B) \cdot (C_{in}) + \overline{(A \oplus B)} \cdot A \quad (10)$$

$$C_{out}=(A \oplus B) \cdot (C_{in}) + \overline{(A \oplus B)} \cdot B \quad (11)$$

The circuit in FIG. 6a implements equation (10). Two conditions are satisfied by this circuit. When A and B are not equal, the signal on the carry-in terminal is passed to the carry-out terminal and when A and B are equal, the signal on A is passed to the carry-out terminal. As shown in FIG. 6a, the two single bits being added, A and B, are applied to the two input terminals of XOR gate 51. If A and B are equal, a low output signal from XOR gate 51 turns on pass transistor T1 and turns off pass transistor T2, allowing passage of the signal from A to the carry-out terminal $C_{out}$. If A and B are not equal, the output of XOR gate 51 is high, which turns on pass transistor T2 and turns off pass transistor T1. This in turn allows passage of the signal on the carry-in terminal $C_{in}$ to the carry-out terminal $C_{out}$.

FIG. 7a shows a full adder. FIGS. 6b and 7b show alternative representations of the circuits of FIGS. 6a and 7a respectively. The inverter and transistors of FIGS. 6a and 7a are represented as a multiplexer M in the illustrations of FIGS. 6b and 7b.

It will now be shown by comparing FIG. 2 and FIG. 7a that the fast carry logic described above provides faster propagation of the carry signal than a conventional ripple carry adder. FIG. 7a shows one stage of a full adder circuit constructed according to the invention. The carry propagation is controlled as discussed above in connection with FIG. 6a. As discussed above and shown in FIG. 2, the propagation delay of a conventional ripple carry adder is 1 AND gate plus 1 OR gate per pair of bits added plus 1 XOR gate. By contrast, as shown in FIG. 7a, the worst-case delay of a circuit according to the invention occurs when one of the input signals, in this case $B_i$, is propagated to the carry out signal, that is, when the signal propagates through XOR gate 91 plus inverter 92 to turn on the pass-transistor 93. This happens simultaneously for all bits being added. The propagation delay for a carry signal to propagate through a long series of transistors such as transistor 94 adds only minimal time compared to a gate delay for generating the result of an addition. If four full-adder circuits such as shown in FIG. 7a are cascaded, in the worst case the output signal $C_{out}$ is available after an XOR gate delay plus an inverter delay plus the very small propagation delay through four pass transistors.

SUMMARY OF THE INVENTION

According to the present invention, a programmable logic device having configurable logic blocks is provided with a circuit for implementing a fast carry logic. The fast carry logic circuit is useful when implementing adders, subtractors, accumulators, and other functions that use carry logic. The fast carry path is realized in dedicated hardware and dedicated interconnect circuitry within a configurable logic array, while a carry propagate signal used to generate the carry signal is implemented in programmable function generators. This dedicated carry path circuitry allows high speed propagation of the carry signal, and high density of logic functions that use carry logic. The carry propagate signal is also used to generate the sum. Several embodiments are described, one in which the sum is computed in a programmable function generator, one in which a dedicated XOR gate provides the sum, and one in which hardware for generating the carry propagate signal can also generate other logic functions.

In one embodiment, a circuit using carry logic is about four times as fast as the prior art, can be realized with about one-half the number of logic blocks, and leaves general purpose logic resources free for other functions. One embodiment also allows for adding or subtracting a constant to a variable without using interconnect circuitry for providing the constant.

The invention takes advantage of a Boolean functional simplification of one of two logically equivalent carry functions:

$$C_{i+1}=(A_i @ B_i) \cdot (C_i) + \overline{(A_i @ B_i)} \cdot B_i \quad (8)$$

$$C_{i+1}=(A_i @ B_i) \cdot (C_i) + \overline{(A_i @ B_i)} \cdot A_i \quad (9)$$

The fast carry path receives the above $C_i$ function and generates the above $C_{i+1}$ function. The XOR functions of $A_i$ and $B_i$ in the above equations are generated by look-up table function generators. The carry path is implemented in an array, with the carry out of one bit connected to the carry in of the next bit. Thus a high speed carry path is achieved. In one embodiment, an XOR gate is also provided so that the sum function $S_i$ can be completed without requiring more than one function generator for one bit.

When the carry logic hardware is incorporated in a configurable logic array in conjunction with general purpose logic blocks, the fast carry logic circuits preferably have a dedicated interconnect structure between carry inputs and carry outputs of adjacent logic blocks which further increases the performance.

The carry logic hardware can include additional structures such as multiplexers so that the multiplexers which generate a carry signal can also generate combinational logic functions as well.

BRIEF DESCRIPTION OF THE DRAWINGS

FIG. 1b is a schematic symbol for the conventional full-adder stage shown in FIG. 1a.

FIG. 6a is a schematic diagram of a circuit providing one bit of carry logic according to the present invention. FIG. 6b shows an alternative representation of the circuit of FIG. 6a.

FIG. 6c is a truth-table for displaying the relationship between the variables A, B, $C_{in}$ and $C_{out}$.

FIG. 7b shows an alternative representation of the circuit of FIG. 7a.

FIG. 9a shows a look-up table embodiment of the F and G function generators of FIGS. 8a and 8b.

FIG. 9b shows another look-up table embodiment of the F and G function generators of FIGS. 8a and 8b.

FIG. 9c shows one Karnaugh map for the look-up table function generator of FIG. 9a or 9b.

FIG. 9d shows one of the $2^{16}$ logic functions which can be implemented by the look-up table function generator of FIG. 9a or 9b.

FIG. 10 shows a schematic diagram of a logic block having two stages, used in the Xilinx, Inc. XC4000 family of devices, which includes the circuit of FIG. 8a.

FIG. 12e represents an FPGA chip comprising core tiles such as shown in FIG. 12c and edge and corner tiles for connecting off chip.

DETAILED DESCRIPTION

Figure 8A:
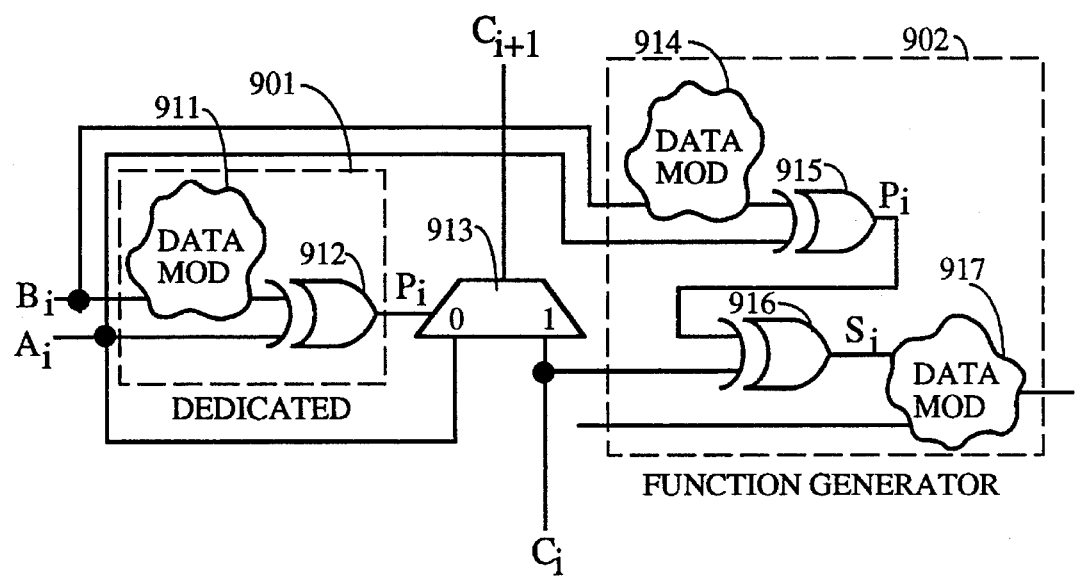
FIG. 8a shows a simplified diagram of the arithmetic portion of the carry logic used in the Xilinx, Inc. XC4000 family of devices.
Figure 8B:
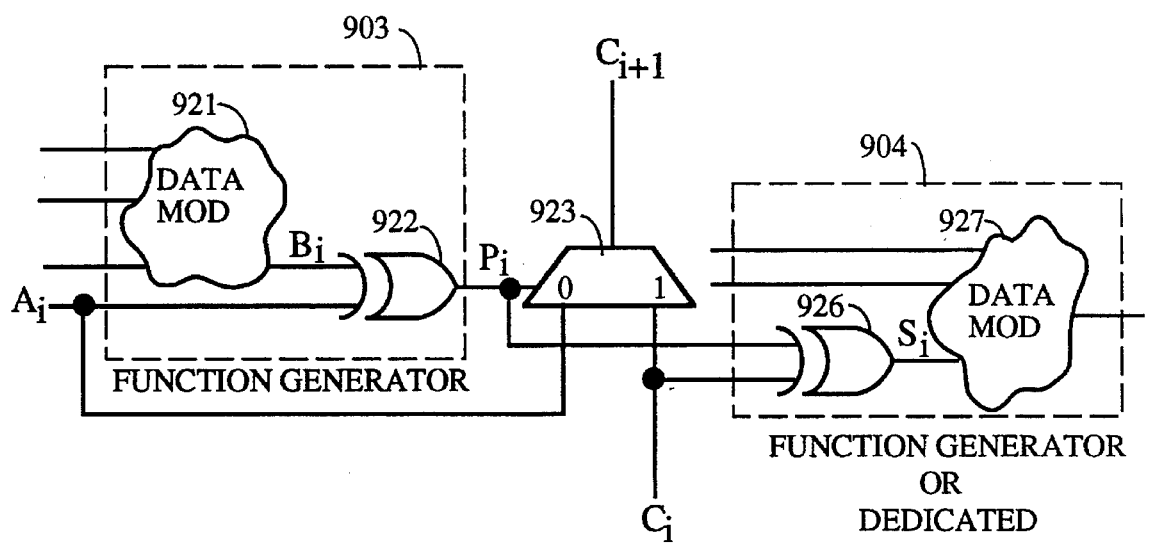
FIG. 8b shows a simplified diagram of the arithmetic portion of the carry logic in accordance with the invention.

FIG. 8a illustrates a prior art circuit for implementing carry logic in a configurable logic block. FIG. 8b illustrates a circuit according to the present invention. According to the invention, the arithmetic logic is implemented in a combination of programmable devices and hardware. As in the prior art device, the carry path is implemented by hardware in order to achieve high speed, comprising MUX 913 in FIG. 8a and MUX 923 in FIG. 8b. As shown in FIG. 8a, data modification function 911 and XOR gate 912 for receiving input signals are also implemented in dedicated hardware while additional data modification functions 914 and 917 and XOR gates 915 and 916 used for computing the sum are implemented in programmable function generator 902.

In FIG. 8b, data modification circuitry 921 and XOR gate 922 are implemented in function generator 903 while XOR gate 926 for calculating the sum is implemented in unit 904 which is either a programmable function generator or a dedicated XOR gate.

Figure 8C:
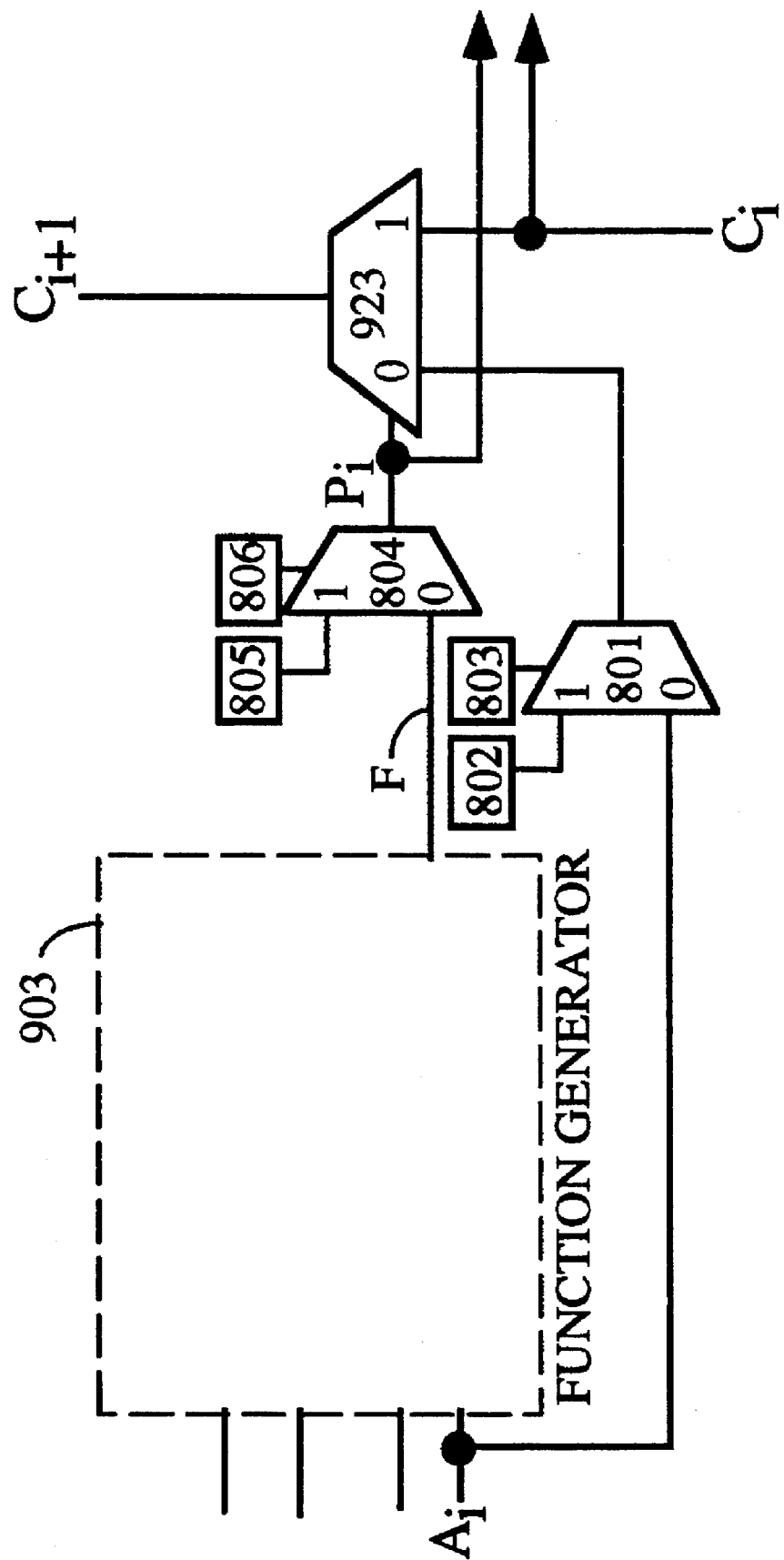
FIG. 8c shows a carry logic circuit which can also generate other logic functions.

FIG. 8c illustrates another circuit according to the present invention which can implement fast carry logic as in FIG. 8b and can alternatively implement several frequently used logic functions. Multiplexers 801 and 804 allow the user to select between forwarding signals as in FIG. 8b and providing a constant zero or one to an input and the control terminal respectively of carry multiplexer 923. Memory cells 803 and 806 control multiplexers 801 and 804 respectively to make these selections. When multiplexers 801 and 804 are forwarding, respectively, the Ai signal and the F output of function generator 903, the structure of FIG. 8c operates as that of FIG. 8b. In FIG. 8c, multiplexers 801 and 804 allow a user to select between the functions provided by FIG. 8b and other combinatorial functions, as illustrated in TABLE I. Multiplexer 804 allows function generator 903 to be used independently of the carry chain when the carry chain is being used to skip or initiate an operation.

TABLE I

| | 806 | 805 | 803 | 802 | $A_i$ | Function |
|---|---|---|---|---|---|---|
| 1) | 1 | 0 | 1 | 0 | x | $C_{i+1} = 0$ |
| 2) | 1 | 0 | 1 | 1 | x | $C_{i+1} = 1$ |
| 3) | 1 | 0 | 0 | x | $A_i$ | $C_{i+1} = A_i$ |
| 4) | 1 | 1 | x | x | x | $C_{i+1} = C_i$ |
| 5) | 0 | x | 1 | 0 | x | $C_{i+1} = C_i$ AND $\overline{F_i}$ |
| 6) | 0 | x | 1 | 1 | x | $C_{i+1} = C_i$ OR $\overline{F_i}$ |
| 7) | 0 | x | 0 | x | $A_i$ | Adder operation (as in FIG. 8b) |
| 8) | 0 | x | 0 | x | 0 | $C_{i+1} = C_i$ AND $\overline{F_i}$ |
| 9) | 0 | x | 0 | x | 1 | $C_{i+1} = C_i$ OR $\overline{F_i}$ |

The functions in TABLE I are all commonly used functions.

The addition of the two multiplexers 801 and 804 with their controlling memory cells 802, 803, 805, and 806 increases the power of the structure of FIG. 8b with very little increase in chip area.

Multiplexer 804 allows a choice between three modes. For arithmetic, multiplexer 804 provides the F output of function generator 903 (while function generator 903 is programmed as shown in FIG. 8b). Multiplexer 804 can also be programmed to provide a constant signal from memory cell 805.

A logic 0 in cell 805 causes multiplexer 923 to take its input from multiplexer 801. Thus a constant signal provided by memory cell 802 can be provided to initiate a carry operation. Even without multiplexer 801, multiplexer 804 will route the $A_i$ signal to carry-out terminal $C_{i+1}$. A logic 1 in cell 805 can be used to cause multiplexer 923 to skip over the logic block.

Multiplexer 801 is useful in arithmetic operations to initiate a carry value, and in logic operations to initiate an AND function (by inputting a logic 1 in memory cell 802) or an OR function (by inputting a logic 0 in memory cell 802). It also provides a fixed value (0 in the case of an AND function, 1 in the case of an OR function) when multiplexer 923 is used to generate an AND function or an OR function of $C_i$ and $F_i$. Thus in other embodiments, either of multiplexers 801 and 804 is useful alone as well as in the combination shown in FIG. 8c.

Carry Logic as Implemented in the Xilinx XC4000 Family Device

FIGS. 10, 11a, 11b, and 11c show circuit diagrams used in the Xilinx XC4000 family devices for implementing the structure of FIG. 8a.

Figure 10:
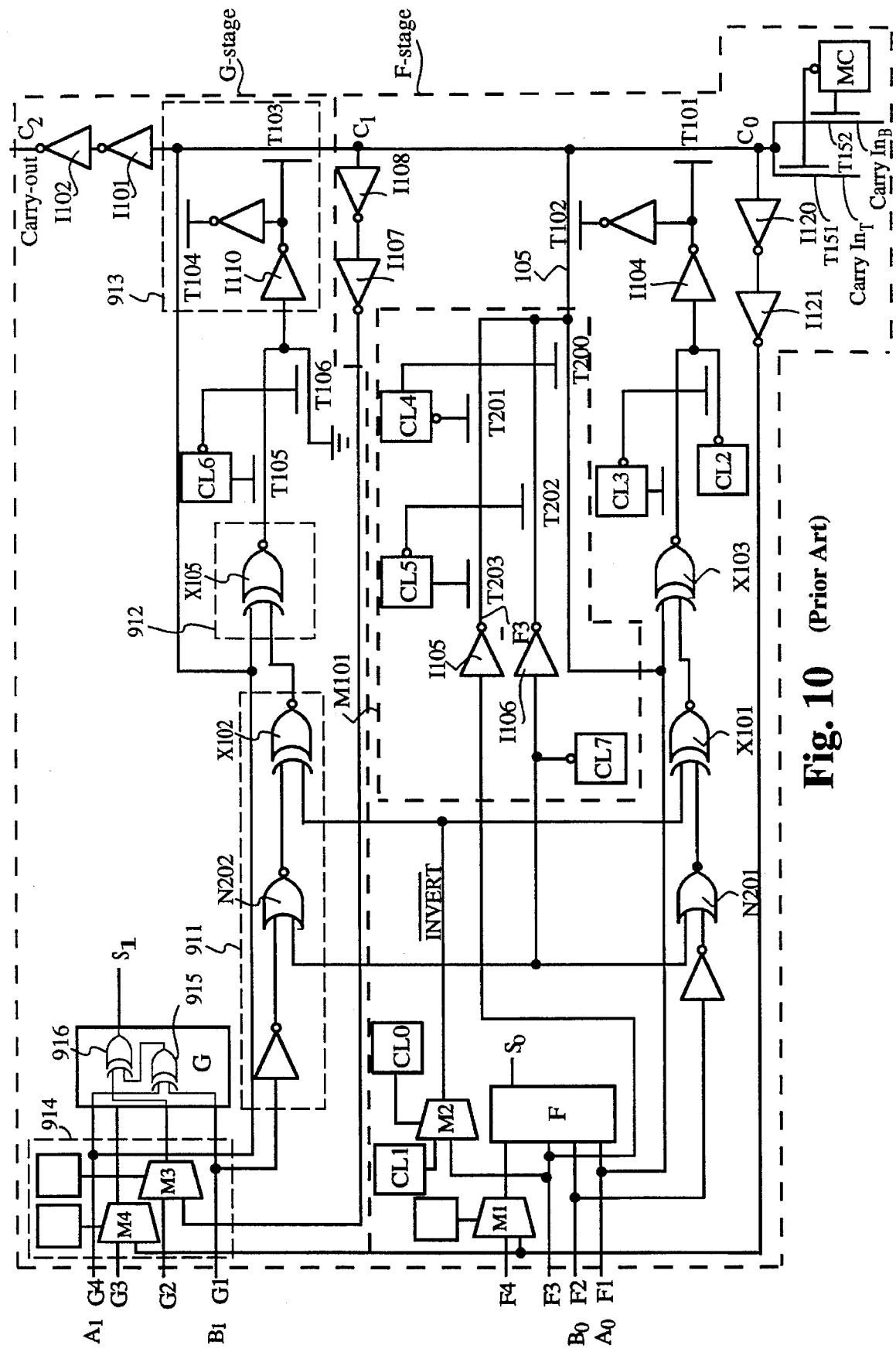

In FIG. 10, the fast carry logic is incorporated in a circuit containing look-up table function generators, multiplexers, memory cells and extra logic gates which are used in configuring the circuit for multiple uses.

Operation of the look-up table function generators will be described in connection with FIGS. 9a–9d. FIG. 9a illustrates a 16-bit look-up table capable of producing an output signal in response to any one of sixteen possible combinations of four input signals. Thus input signals A and B control the X decoder to select any one of the four columns in the 16-bit look-up table. Input signals C and D control the Y decoder to select any one of the four rows in the 16-bit look-up table. The 16-bit look-up table produces an output signal representative of the bit at the intersection of the selected row and column. There are 16 such intersections and thus sixteen such bits. There are $2^{16}$ possible combinations of functions capable of being represented by 16 bits. Thus, if a NOR gate is to be simulated by the 16 bits in the look-up table, the Karnaugh map for the look-up table would be as shown in FIG. 9c. In FIG. 9c, all bits are "0" except the bit at the intersection of the first row (representing A=0, B=0) and the first column (representing C=0, D=0). Should a less frequently used function be desired to be generated by the 16-bit look-up table, (for example, should a "1" output signal be desired for A=1, B=0, C=0, D=0) then a binary "1" is stored at the intersection of the second row and the first column. Should a binary "1" be desired both when A=0, B=0, C=0, and D=0 and also when A=1, B=0, C=0 and D=0 then a binary "1" is stored at each of the intersections of the first column with the first row and the second row. The logic circuit represented by this loading of the look-up table is as shown in FIG. 9d. Thus the look-up table of FIG. 9a represents an elegant and simple implementation of any one of $2^{16}$ logic functions.

FIG. 9b shows another structure for yielding any one of sixteen select bits. Each of registers 0–15 in the vertical column to the left labeled "16 Select Bits", contains a selected signal, either a binary 1 or 0. By selecting the proper combination of signals A, B, C, and D and their complements, a particular bit stored in a particular one of the sixteen locations in the 16 Select Bits register is transmitted to the output lead. Thus, for example, to transmit the bit in the "1" register to the output lead, the signal A, $\overline{B}$, $\overline{C}$, D is applied to the leads so labeled. To transmit the signal labeled "15" in the sixteenth location in the 16 Select Bits register to the output lead, the signal A, $\overline{B}$, $\overline{C}$, $\overline{D}$ is applied to the appropriate columns. Again, any one of $2^{16}$ logic functions can be implemented using this structure.

With regard to FIG. 10, input terminals F1 and F2 provide input signals $A_0$ and $B_0$, respectively. Function generator F, XNOR gate X101, memory cells CL0, CL1, multiplexer M2, and a third input terminal F3, work in conjunction to allow the same circuit to function selectively as an adder or as a subtractor. A device in which a storage cell (not shown) receives an output signal $S_0$ from function generator F allows the circuit to function as an accumulator or counter as well. One input of the XNOR gate X101 is the output of M2, and the other input is the output of NOR gate N201. The two inputs to the NOR gate N201 are the complement of the signal on input terminal F2 and the complement of the value in CL7. For the circuit to function as a middle stage in a multi-bit adder, CL7 is set to input a low signal to NOR gate N201. This results in the output of NOR gate N201 being the signal on input terminal F2.

To control whether the circuit functions in the increment mode or the decrement mode, multiplexer M2 determines whether the signal provided by NOR gate N201 will or will not be inverted by XNOR gate X101. The value provided by M2 is provided by F3 or CL1 as controlled by CL0. CL1 is typically used to provide a static value while F3 provides a dynamically changing signal.

When M2 causes the circuit to function in the increment mode, the signal $B_0$ is propagated through XNOR gate X101 to XNOR gate X103. The truth-table of an XNOR gate shows that an input signal on one terminal of an XNOR gate is passed to the output of the XNOR gate when the signal on the other input terminal is high. Therefore, when the output of M2 is high, the carry-logic functions in the increment mode. When the output of M2 is low, however, signal $B_0$ is inverted by XNOR gate X101, and the carry logic of the circuit functions in the decrement mode. Further, if the control signal for selecting the increment/decrement mode originates on the F3 terminal, then this signal will also be applied to function generator F so that the sum logic implemented in function generator F will accordingly also function in either the increment or decrement mode.

First consider that the circuit is being used as an adder or incrementer and that multiplexer M2 is providing a high signal, so that the input $B_0$ is passed to the input of XNOR gate X103.

Figure 7A:
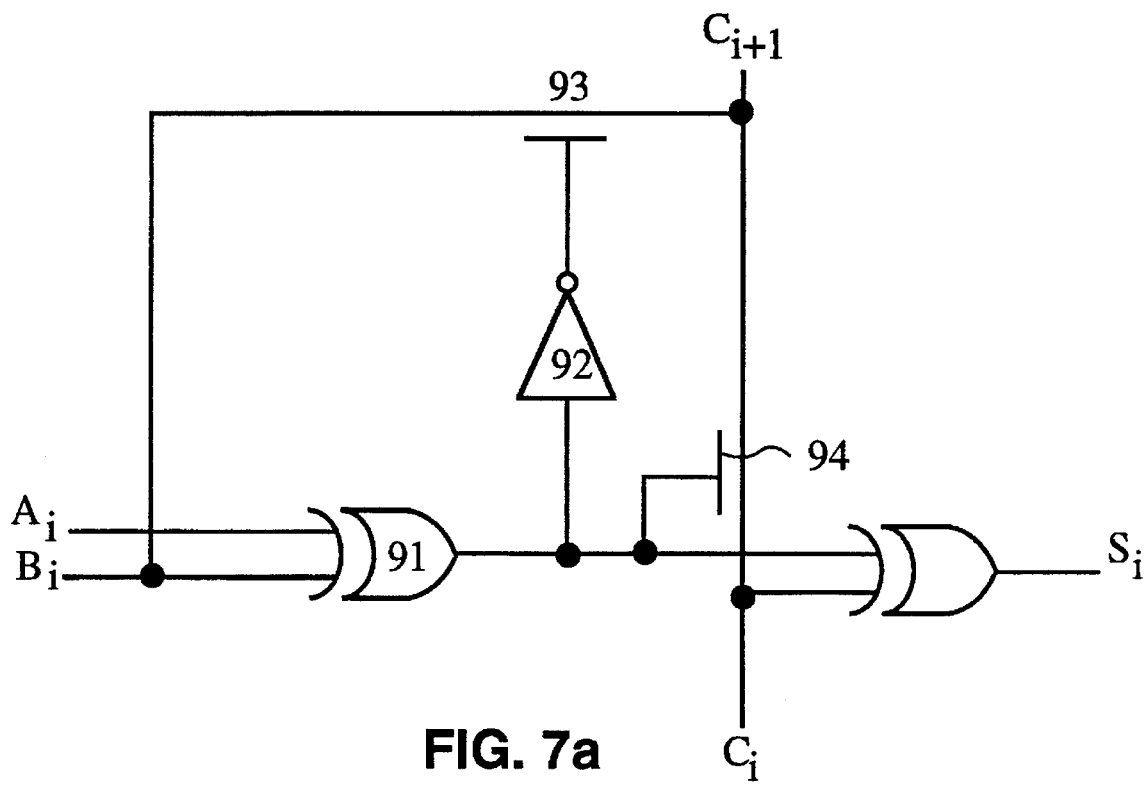
FIG. 7a is a schematic diagram of a circuit providing one bit of a full adder that uses the carry logic provided by the present invention.
Figure 7B:
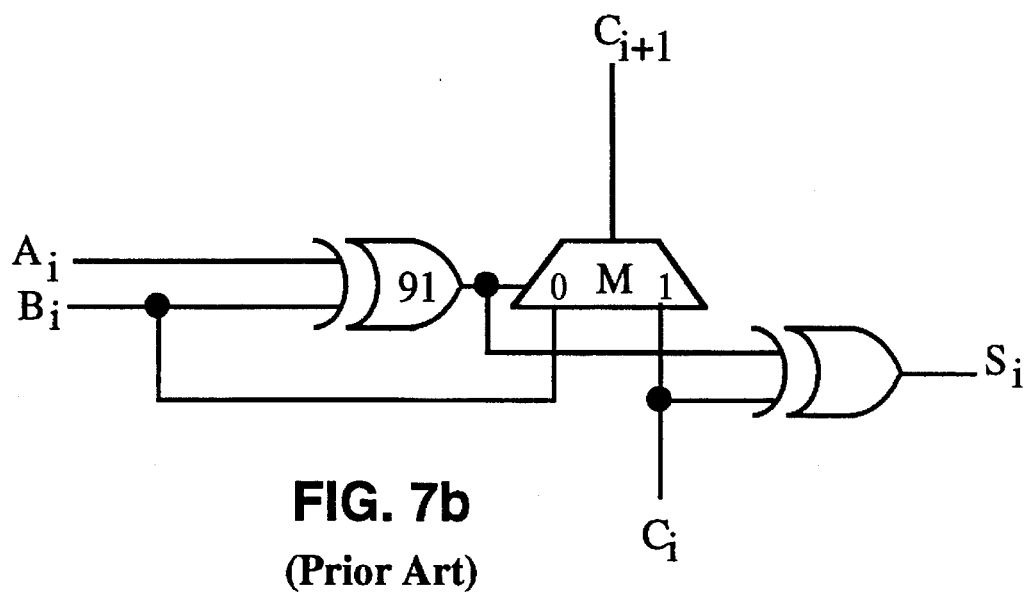

A second group of memory cells, CL2–CL5 and CL7, work together to allow the circuit of FIG. 10 to perform several functions. For the circuit to operate as a middle stage in a multi-bit adder, memory cells CL3, CL4 and CL5 are set high. Thus the combination X103 and I104 acts as an XOR gate (equivalent to XOR gate 91 in FIG. 7a) so that the output of XNOR gate X103 will pass through inverter I104. Setting memory cell CL4 high places the signal from terminal F1 onto line 105. In this configuration the F-stage of FIG. 10 is equivalent to the carry circuit of FIGS. 6a and 7a. The signal from F1 is propagated to $C_1$ if transistor T102 (equivalent to transistor 93 of FIG. 7a) turns on in response to $A_0$ being equal to $B_0$. Setting memory cell CL5 high prevents the value in cell CL7 from simultaneously being propagated to line 105.

Setting memory cell CL3 low causes transistors T101 and T102 to be controlled by the signal in memory cell CL2. If CL2 is high, transistor T101 turns on, causing $C_0$ to be propagated to $C_1$. This configuration of memory cells CL2 and CL3 allows the carry signal $C_0$ to skip the carry logic of the F-stage. Skipping the carry logic of a particular stage in this way can be useful if layout constraints require a particular stage in a logic block to be used for something other than a stage in the adder (or counter, etc.).

If memory cell CL2 is set low (while CL3 is still low), T101 turns off and T102 turns on. When T102 is on, the signal on line 105 will be propagated to $C_0$. The signal on line 105 is controlled by memory cells CL4, CL5, and CL7, which together with inverters I105 and I106 make up 3:1 multiplexer M101. Multiplexer M101 controls which of 3 signals, the signal on terminal F1, the complement of the signal on terminal F3 ($\overline{F3}$), or the signal in memory cell CL7, will be placed on line 105. Note that the signal on F3 may be used by multiplexer M2 or by multiplexer M101.

As noted earlier, when the F-stage operates as a middle stage in a multi-bit adder, memory cells are programmed so that the signal on terminal F1 is placed on line 105. In addition CL3 is set high so that the value provided by XNOR gate X103, which is set to be a function of the $A_0$ and $B_0$ inputs on lines F1 and F2, will determine whether the carryin signal $C_0$ or the value on F1 is propagated.

For the F-stage to add the least significant bit in a multi-bit adder, the carry-in can be preset to zero by applying a logic zero to one of Carry-In$_T$ or Carry-In$_B$ and setting memory cell MC to propagate the signal. (Generating this logic zero signal is discussed below in conjunction with FIG. 11a.)

Alternatively, to preset the carry-in signal $C_0$ of the G-stage, any of the signal on $\overline{F3}$, the signal in CL7 or the signal on F1 can be used. The signal $\overline{F3}$ is selected to be placed on line 105 by setting CL5 high and CL4 low, and the signal in CL7 is selected by setting both CL4 and CL5 low. The F1 input terminal can also be used to preset the $C_1$ signal when the lowest order bit will be calculated in the G-stage. F1 can be used when the F1 input to the F function generator is not needed. To use F1 as the input for presetting $C_1$, high signals are stored in memory cells CL4 and CL5. Additionally, CL3 is set low and CL2 is set low, turning off transistor T101 and turning on transistor T102 so that the signal on line 105 will propagate to $C_1$.

In addition to functioning as a part of the 3:1 multiplexer M101, memory cell CL7 controls one input to NOR gates N201 and N202. For the F-stage to function as a middle stage in a multi-bit adder for adding values $A_0$ and $B_0$ on terminals F1 and F2, CL7 is set high so that the output of N201 is the signal on the input terminal F2. To add a constant to the input value $A_0$ on F1, CL7 is set low. This forces the input of N201 high, which forces the output of N201 low, and causes the addend to be selected by multiplexer M2. Memory cell CL0 can cause M2 to select between applying the value in CL1 and the value of F3 to XNOR gate X101 for generating an output to be added by X103 to $A_0$ on terminal F1. Thus, by programming CL7 low, a bit can be programmed to a constant value to be added to an input value without having to use the interconnect resources to which terminal F2 would be connected, which may be needed for carrying signals to other logic blocks (not shown).

Not all combinations of logic values in the memory cells of FIG. 10 are acceptable. For example, within M101, contention is possible if memory cell CL4 is high and memory cell CL5 is low, since both high and low signals could be simultaneously placed on line 105. To prevent such contention, software for programming the memory cells may be programmed to prevent this combination. Alternatively, an extra memory cell may be added to select only one of the two signals to be placed on line 105.

Figure 5:
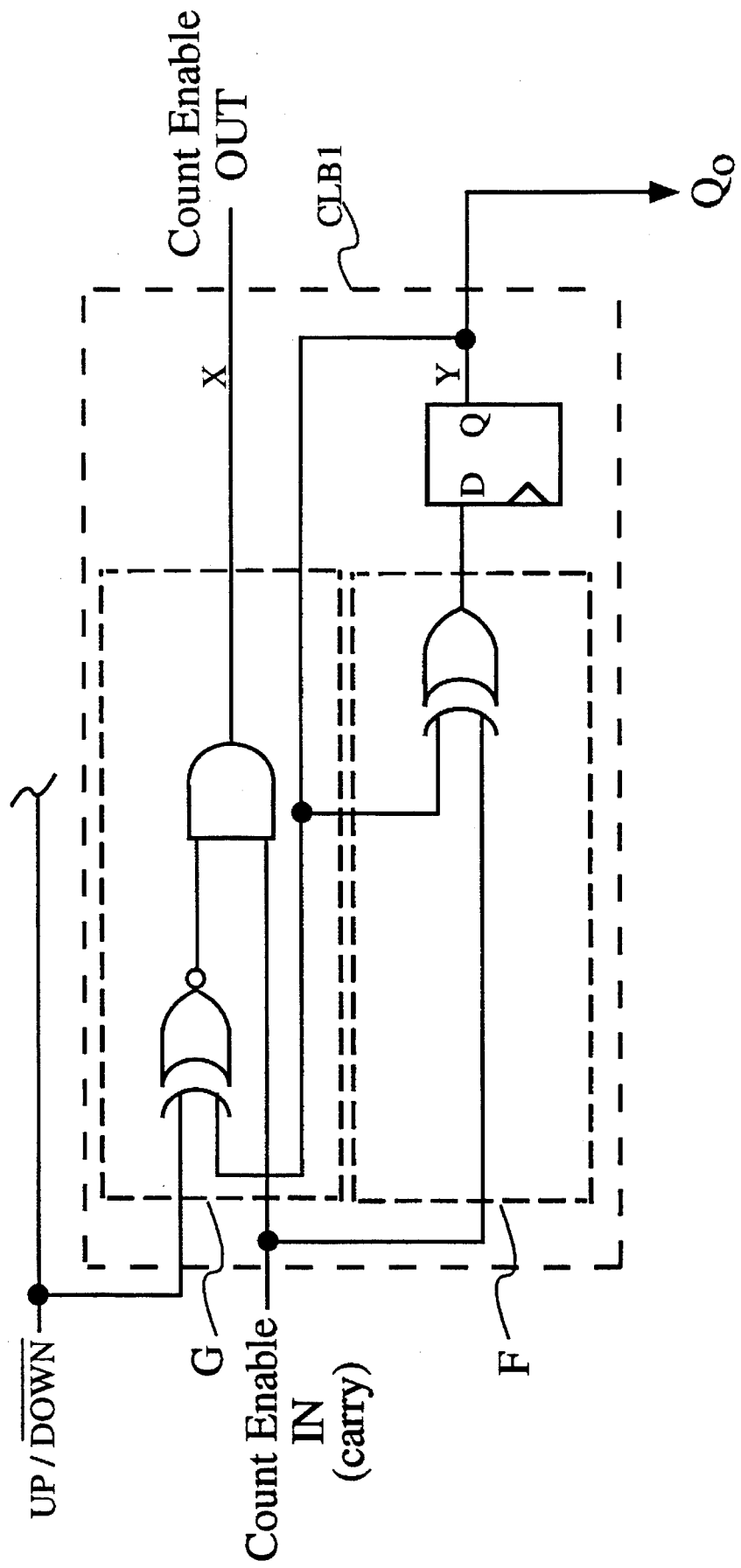
FIG. 5 is a schematic diagram of a prior art counter.

As discussed above, two stages, F-stage and G-stage, each representing one bit of a multi-bit adder, are cascaded together as in FIG. 10. Thus a single logic block can implement two bits in a multi-bit function that uses carry logic. This is a distinct improvement in the density of components required to implement functions that use carry logic compared to the earlier Xilinx devices. By contrast, as shown in FIG. 5, a multi-bit counter is realized in prior-art circuitry with a density of only one bit per logic block.

Regarding the G-stage of FIG. 10, a multiplexer M3 in the G-stage receives the carry-out signal of the F-stage, $C_1$, after it is buffered through two inverters I107 and I108. In an adder, carry-out signal $C_1$ will be combined in the G-function generator with the addends $A_1$ and $B_1$, present on terminals G4 and G1 respectively, to compute the sum bit $S_1$. Carry-out signal $C_1$ of the F-stage is also available to be propagated by transistor T103 to the carry-out $C_{i+2}$ of the G-stage, depending on the configuration conditions of the carry-logic of the G-stage.

Much of the carry-logic of the G-stage is identical to the carry-logic of the F-stage. For example, XNOR gate X102 of the G-stage functions analogously to XNOR gate X101 of the F-stage and is controlled by the output of the same multiplexer M2 to determine whether the G-stage will function as an adder or incrementer on the one hand, or a subtractor or decrementer on the other hand. Additionally, NOR gate N202 of the G-stage functions as NOR gate N201 of the F-stage, where one input is controlled by the memory cell CL7 to allow forcing the addend of the G stage to a constant value without having to use the interconnect resources coupled to the input terminals of the G-stage.

However, instead of memory cells CL2 and CL3 in the F-stage, the G-stage has only one memory cell CL6. CL6 functions similarly to CL3, controlling whether the G-stage functions as a mid-stage in a multi-bit adder or whether the carry signal will bypass the carry logic of the G-stage. When CL6 is high, transistor T105 turns on, and the G-stage functions as a middle stage in a multi-bit adder. When CL6 is low, thereby causing a low signal to be applied through transistor T106 to inverter I110, T103 is on (and T104 off). Turning on transistor T103 allows the carry signal at $C_1$ to bypass the carry logic of the G-stage. As with the F-stage, bypassing the G-stage, or any other particular stage in a logic block, might be required by a design layout which uses the G-stage for a different function.

Multiplexers M3 and M4 in the G-stage are connected and used differently from the multiplexers M1 and M2 of the F-stage. Multiplexer M2 of the F-stage controls whether the carry logic of the G-stage as well as the carry logic of the F-stage will function in an increment-mode or a decrement-mode. However, the G-stage does have its own multiplexer M4 which controls whether the sum logic in the function generator G will perform in the increment-mode or the decrement-mode. M4 is wired to control the sum logic in this way because one of its inputs, G3, is coupled to the same interconnect circuitry (not shown) as is the corresponding input F3 which controls the increment/decrement-mode of the F-function generator.

The other inputs of the multiplexers M3 and M4 of the G-stage are distributed so that signals needed simultaneously are not input into the same multiplexer. To operate as a middle stage in a multi-bit adder, the G-function generator needs both a signal controlling whether it operates in the increment or decrement mode, and a carry-out signal from the less significant bit. Thus, the increment/decrement mode signal applied to F3 is also applied through G3 to multiplexer M4 and the carry out signal from the less significant bit is routed to the multiplexer M3, making both signals available simultaneously to the G-function generator.

Further, in order to detect an overflow, as will be discussed below, the signals $C_1$ and $C_0$ must be compared and so must be available simultaneously. Thus the signal $C_1$ is input to multiplexer M3 and the signal $C_0$ is input to the other multiplexer M4, so that both can be available together to be input to the G-function generator.

The circuit of FIG. 10, comprising two stages cascaded together has the further ability to detect in the G-stage an overflow in processing the most significant bit, performed in a previous block. It is well known in the art to detect an overflow by recognizing that the carry of the sign bit is different from the carry of the most significant bit. Detecting an overflow condition can thus be accomplished by computing the XOR function of the carry of the sign bit and the carry of the most significant bit. In the circuit shown in FIG. 10, the carry of the most significant bit is presented at $C_0$, the carry-in to the F-stage, and the carry of the sign bit (which is a function of the $A_0$ and $B_0$ signals to the F-stage and the $C_0$ signal, is presented to $C_1$, the carry-out of the F-stage. $C_0$ is routed through I120 and I121 to the multiplexer M4 in the G-stage. $C_1$ is routed through I107 and I108 to the multiplexer M3 in the G-stage. To configure the circuit of FIG. 10 to detect an overflow, M3 is programmed to route $C_1$ to the G-function generator, and M4 is programmed to route $C_0$ to the G-function generator. The G function generator is programmed to compute the XOR function of $C_1$ and $C_0$ which, as discussed above, is an overflow detect signal.

The circuit of FIG. 10 can also function in the decrement mode. In the decrement mode, the circuit can decrement a counter or perform subtraction, including subtracting a constant from a variable.

Several modes for performing subtraction can be used with the circuit of FIG. 10. Three common modes for subtraction are two's complement, one's complement and sign-magnitude.

When the two's complement mode of subtraction is to be used, the carry-in bit of the least significant bit is preset to logic one. If the least significant bit is to be provided by the F-stage, the carry in of the least significant bit is preset through Carry $In_T$ or Carry $In_B$ and memory cell MC is set to propagate the signal to $C_0$. To apply a preset signal to Carry $In_B$ or Carry $In_T$ of the F-stage, the preset signal is generated in the F-stage of another logic block, and connected to the F-stage of the least significant bit, by a means to be discussed below, in connection with FIGS. 10–12. The signal may be generated in the F-stage as discussed above and passed through the G-stage to the next logic block by turning on transistor T103 and turning off transistor T104. Thus the carry logic in the G-stage of that logic block used to generate a preset signal is bypassed.

Alternatively, if the least significant bit is to be provided by the G-stage in a two's complement subtraction, then transistor T101 is turned off and transistor T102 is turned on (by setting CL3 low and CL2 low) so that one of the three inputs of multiplexer M101 can be used to preset $C_1$ to logic one. Multiplexer M101 can provide the logic one through the F3 terminal by applying a low signal to F3, and setting CL5 high and CL4 low. Multiplexer M101 can provide the logic one as a stored value in memory cell CL7 by setting CL7 high, CL5 low, and CL4 low. Multiplexer M101 can provide the logic one through the F1 input terminal by applying a high signal on F1, and setting CL5 and CL4 high.

When performing one's complement subtraction or sign-magnitude subtraction, the carry-in of the least significant bit is usually preset to logic zero. In the case of one's complement subtraction the carry-out of the sign bit must be added to the least significant bit to generate the final answer. This may be accomplished by connecting the carry out terminal of the sign bit to the carry in terminal of the least significant bit rather than presetting the carry in of the least significant bit. Alternatively, the carry out of the sign bit is added to the generated sum. When the least significant bit is to be calculated in the F-stage, carry-in $C_0$ is preset to zero by applying a logic zero to Carry $In_T$ or Carry $In_B$ and setting memory cell MC to propagate the signal to $C_0$. When the least significant bit is to be calculated in the G-stage, carry-in $C_1$ is preset to zero through one of the three paths in multiplexer M101 as discussed above. For providing the logic zero through the F3 terminal, a high signal is applied to F3 (since it will be inverted). For providing the logic signal through CL7, the logic zero is loaded into CL7. For providing the logic zero through F1, a low signal is applied to F1.

For both two's complement and one's complement subtraction, the output of multiplexer M2 must be set low. For sign-magnitude subtraction, the output of M2 depends upon whether the signs of the two numbers to be subtracted are the same. For sign-magnitude subtraction, the output of M2 is set low if the two numbers are of the same sign. The output of M2 is set high if the two numbers are of opposite signs.

Circuit of FIG. 10 Used in Multi-Bit Adder

Figure 11A:
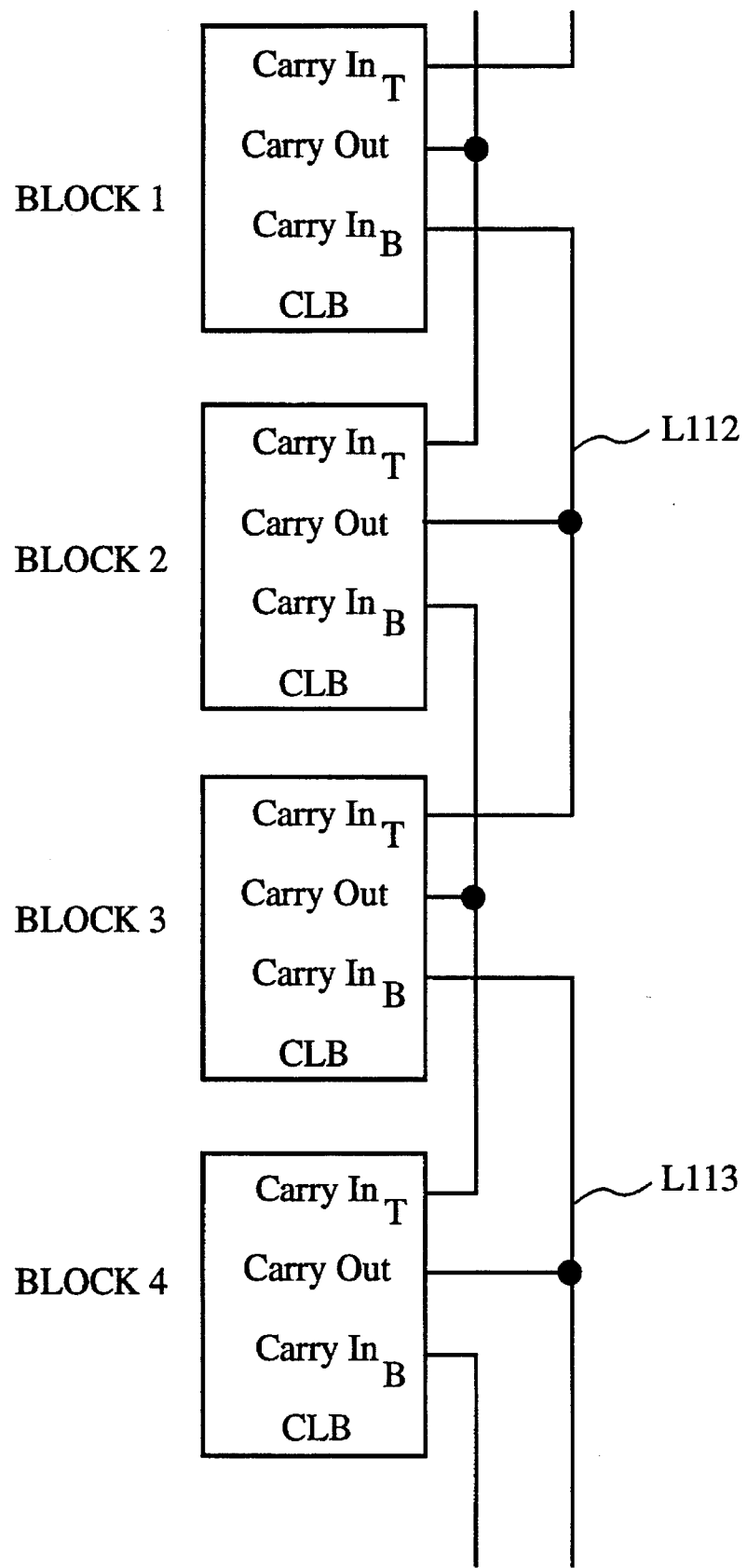
FIG. 11a is a schematic diagram of a logic array showing one embodiment of dedicated-carry-logic interconnect circuitry.

A multi-bit adder, is described with reference to FIG. 11a. Here an ordered array of blocks 1–4, each block comprising a circuit as shown in FIG. 10, is provided such that the carry-out, labeled $C_{i+2}$ in FIG. 10 and labeled Carry Out on each logic block in FIG. 11a is connected both to the carry-in of the logic block above, labeled Carry In$_B$ in both figures and the carry-in of the logic block below, labeled Carry In$_T$ in both figures. Further, each logic block can selectively receive a carry signal either from the logic block above (on terminal Carry In$_T$) or the logic block below (on terminal Carry In$_B$). Whether a logic block receives a carry signal from the logic block above or the logic block below is controlled by memory cell MC. If MC is high, transistor T152 is on, and the carry signal from the logic block below is received on the Carry In$_B$ terminal. If MC is low, transistor T151 is on, and the carry signal from the logic block above is received on the Carry In$_T$ terminal. For example, line L112 connects the carry-out terminal of block 2 to the carry-in terminal Carry In$_B$ of block 1 and to the carry-in terminal Carry In$_T$ of block 3. Similarly, line L113 connects the carry-out terminal of block 4 to the carry-in terminal Carry In$_B$ of block 3 and the carry-in terminal Carry In$_T$ of block 5 (not shown). Thus, block 3 receives a carry signal on Carry In$_B$ from block 4 on L113 and on Carry In$_T$ from block 2 on L112. How memory cell MC is programmed will determine which of transistors T151 and T152 will be on, and thus which of the carry signals will be used by the internal circuitry of logic block 3.

Figure 1A:
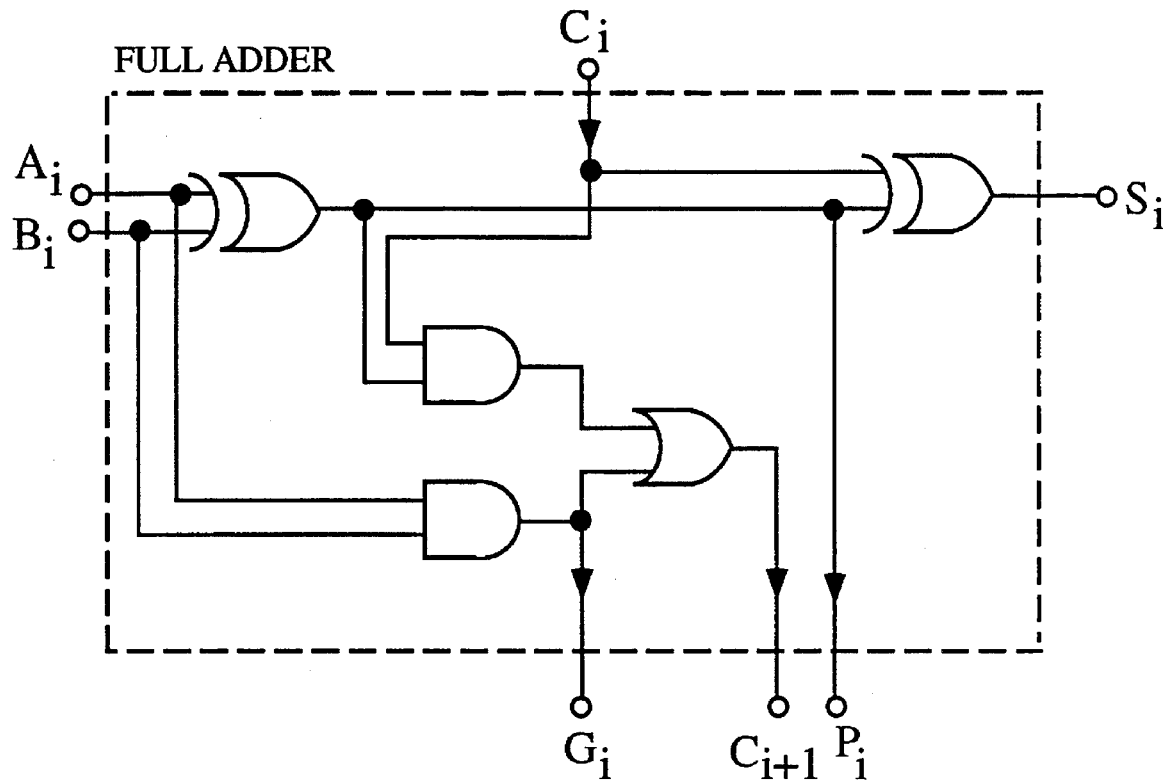
FIG. 1a is a schematic diagram showing one stage of a conventional full-adder.
Figure 1B:
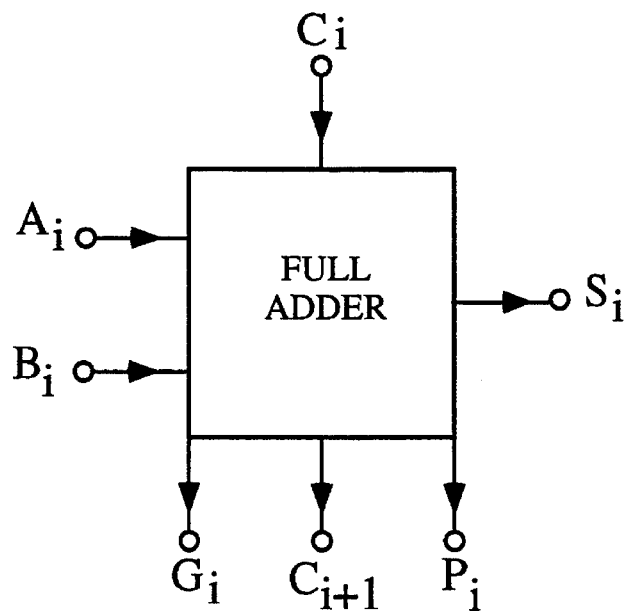
Figure 2:
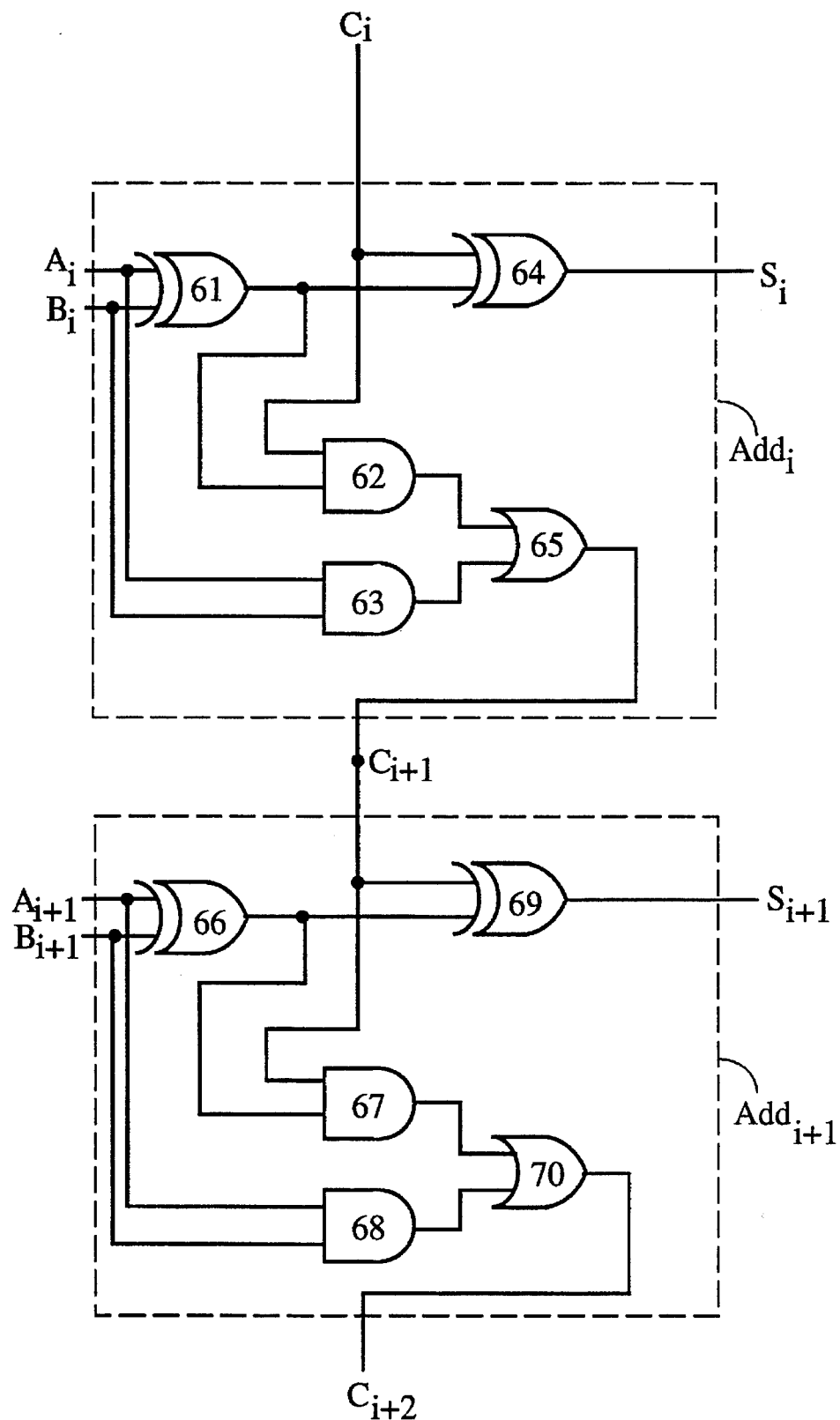
FIG. 2 is a schematic diagram of two full adders cascaded together.
Figure 3:
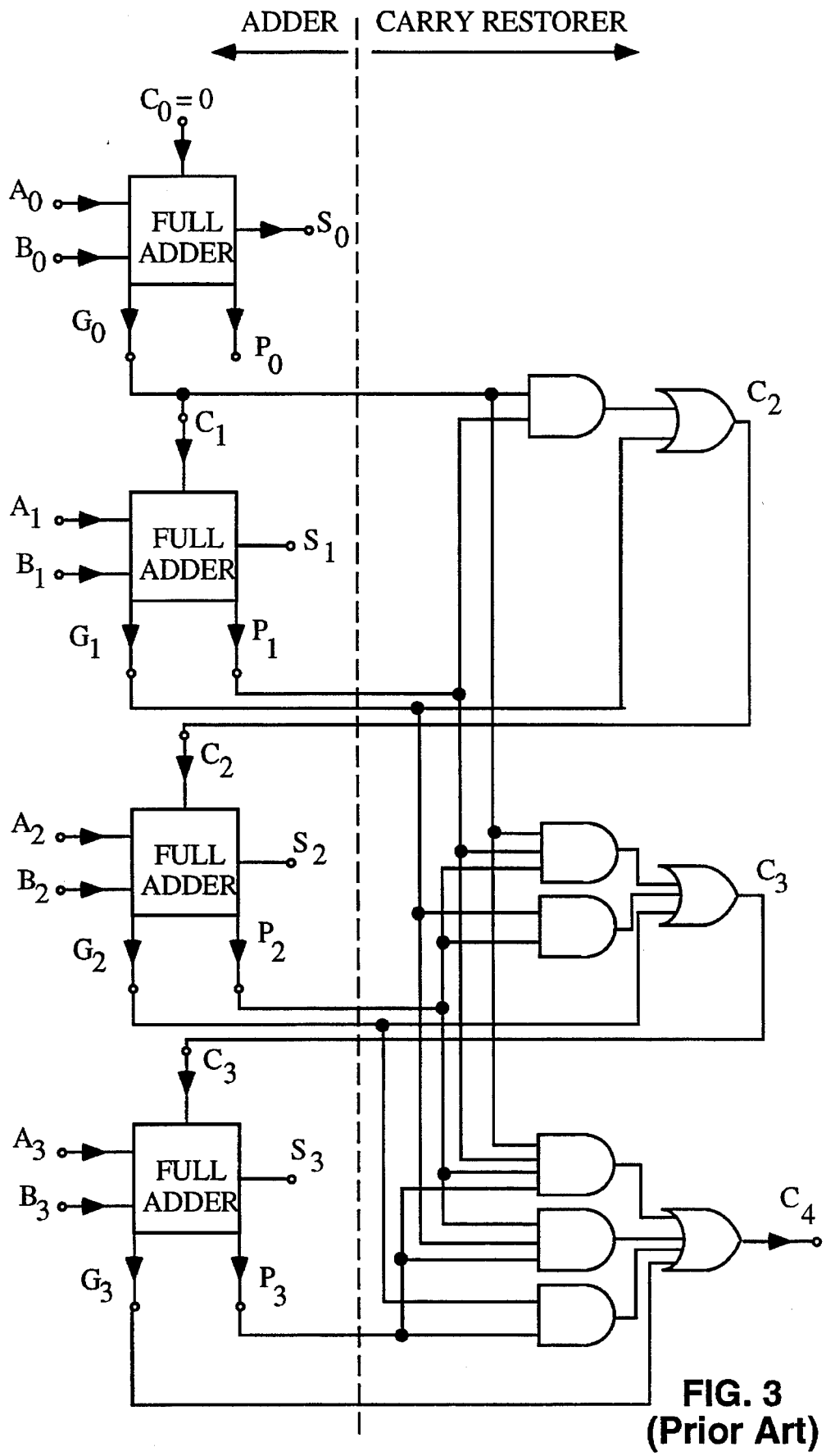
FIG. 3 is a schematic diagram of a four-bit adder with look-ahead carry logic.
Figure 4A:
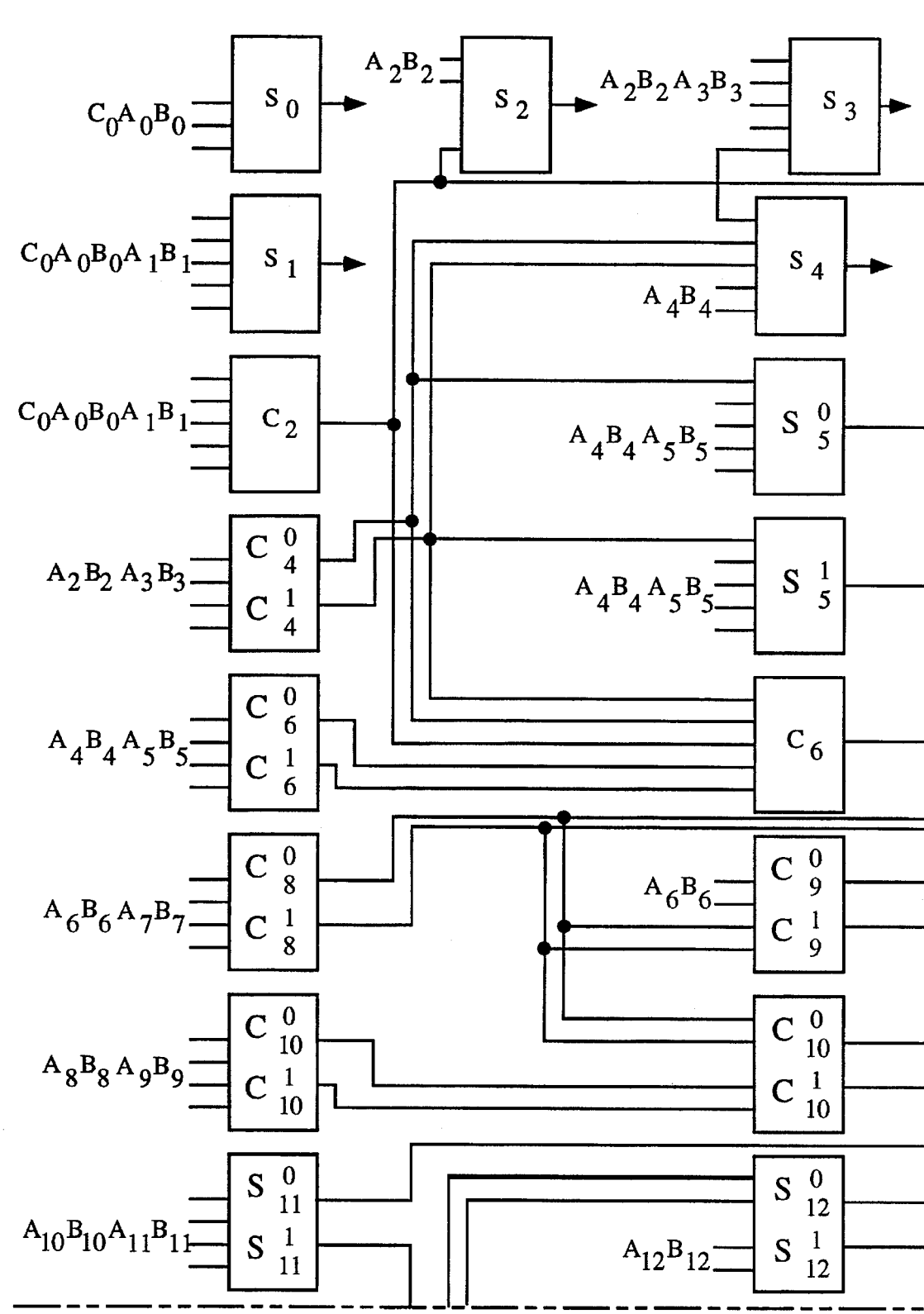
FIG. 4 is comprising FIGS. 4A through 4d a schematic diagram of a prior art adder.
Figure 4B:
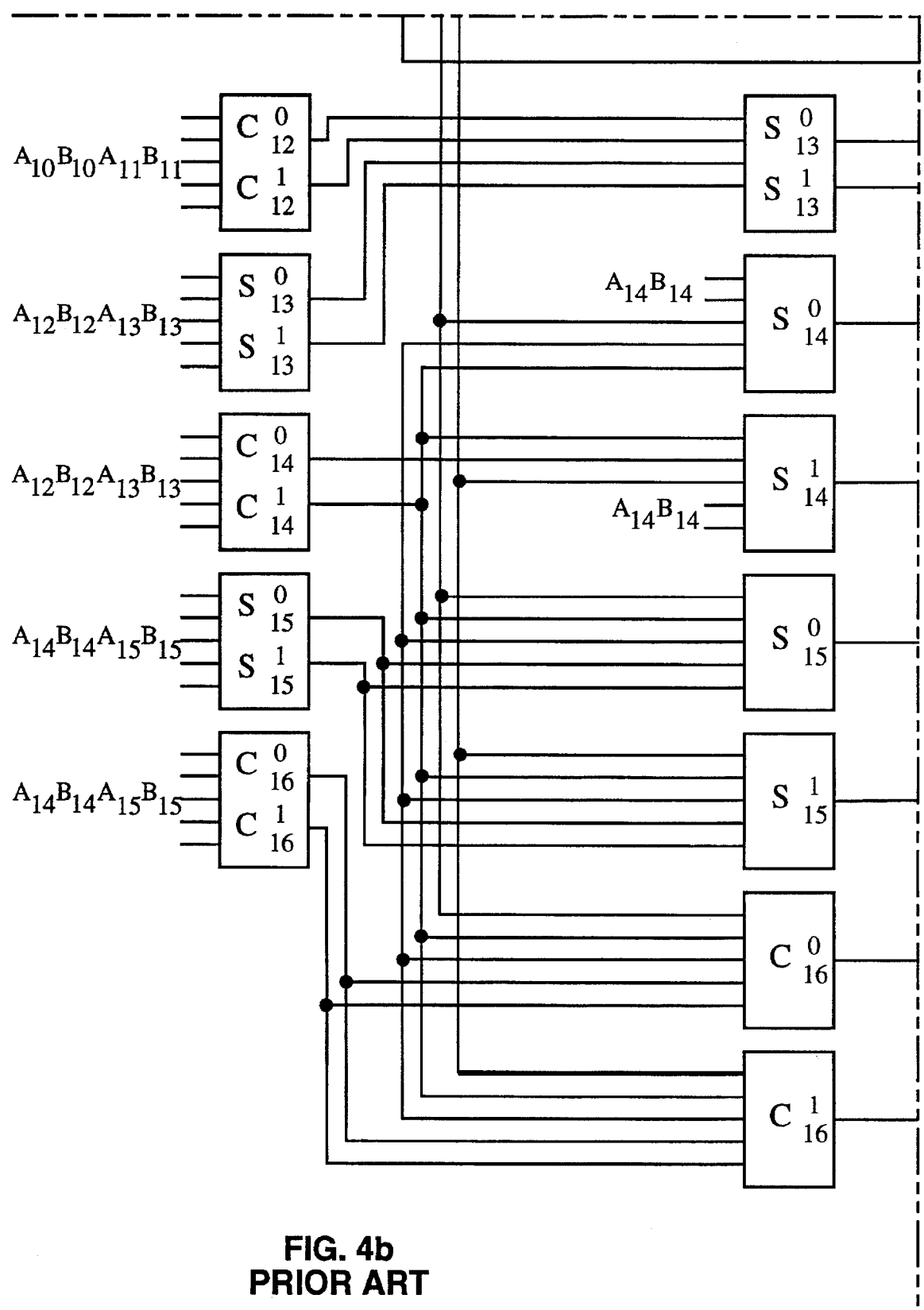
Figure 4C:
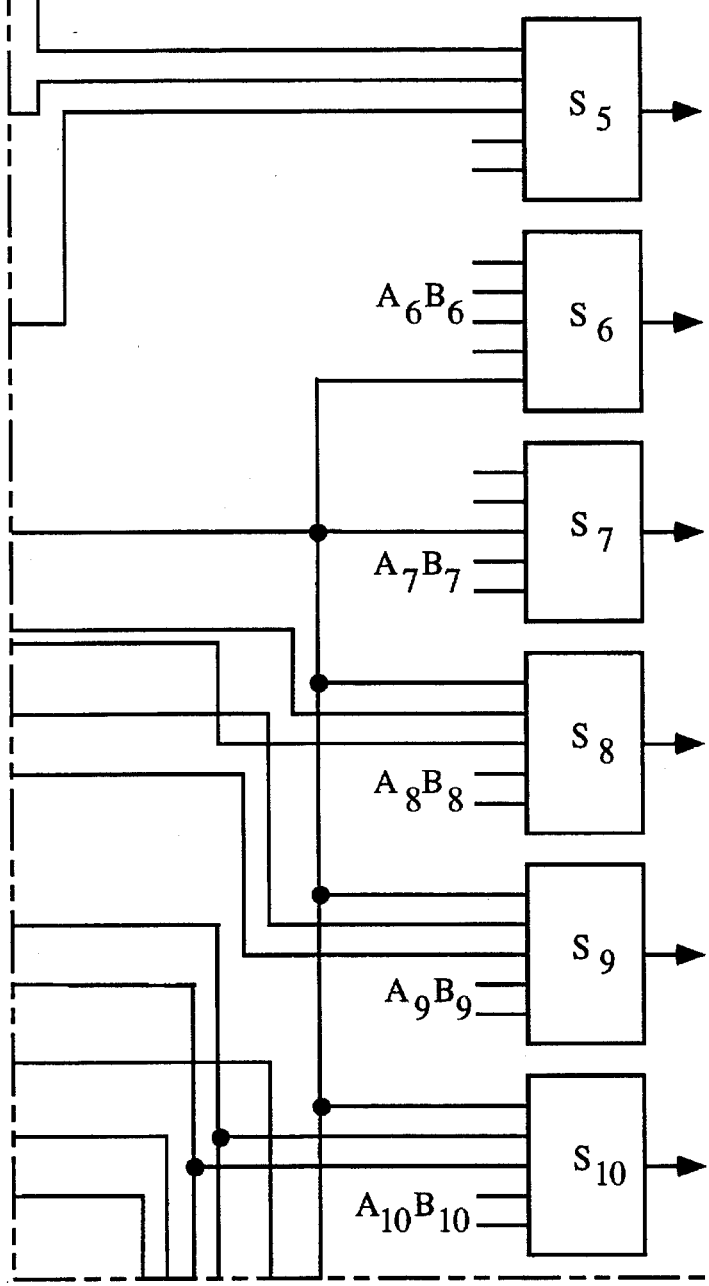
Figure 4D:
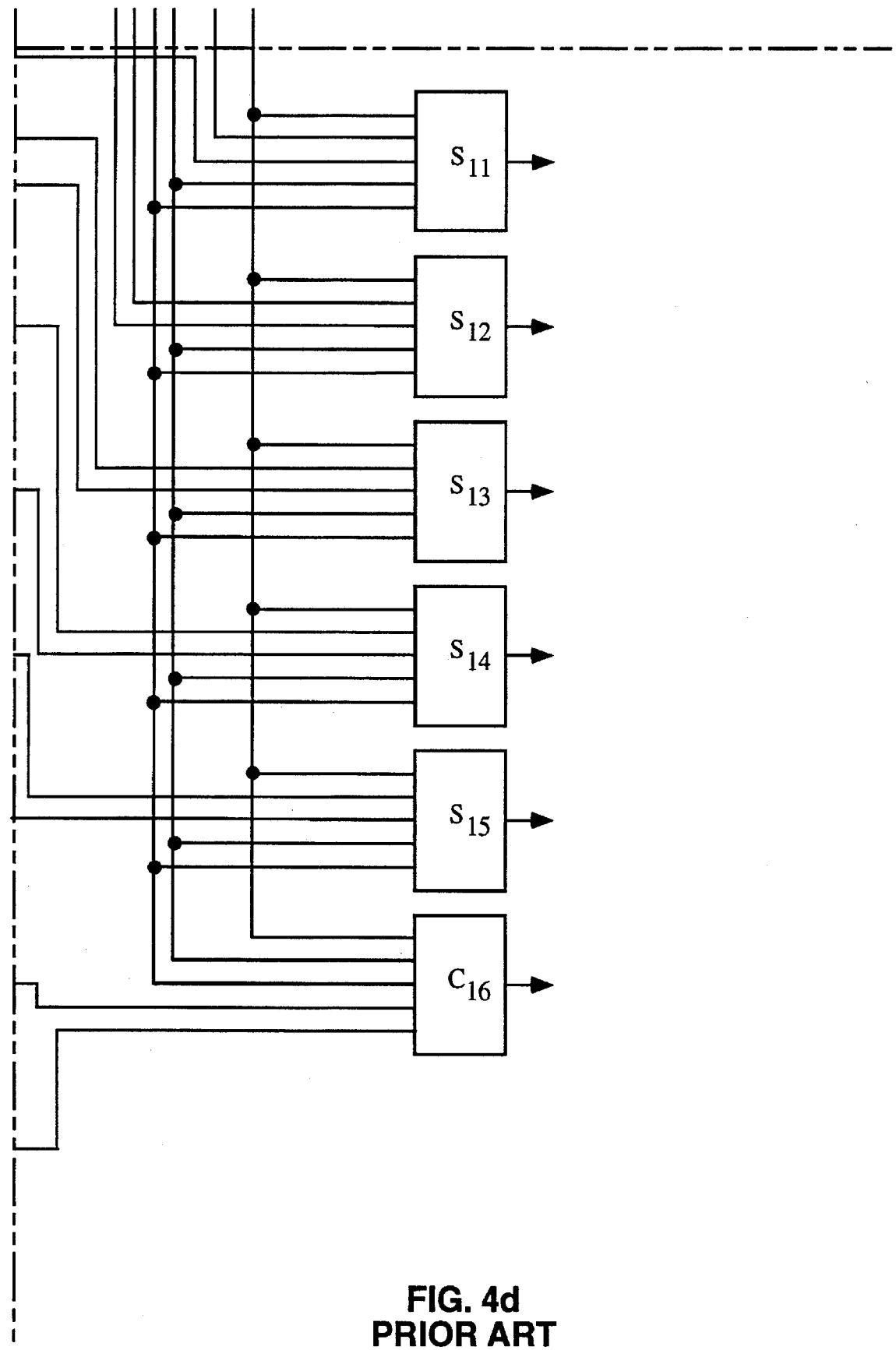

As shown in FIG. 10, two additional gate delays per two bits are added by inverters I101 and I102 in order to maintain signal quality on a long line (approximately four gate delays for four bits). By contrast, the output signal $C_{out}$ of four cascaded conventional ripple carry full-adders, such as shown in FIG. 2, is not available until one XOR gate, four AND gates and four OR gates are passed (nine gate delays). Furthermore, whereas look-ahead carry circuits such as shown in FIG. 3 achieve faster carry propagation only through a much higher density of components, the circuit of FIG. 10 requires no more components than a conventional ripple carry adder.

The primary benefit of dedicated carry interconnect circuitry is that it performs much faster than does programmable carry interconnect circuitry. This increased performance is traded for the flexibility of the programmable interconnects. However, the dedicated interconnect circuitry shown in FIG. 11a is flexible in that the carry signals can be propagated in either of two directions through the array.

Figure 11B:
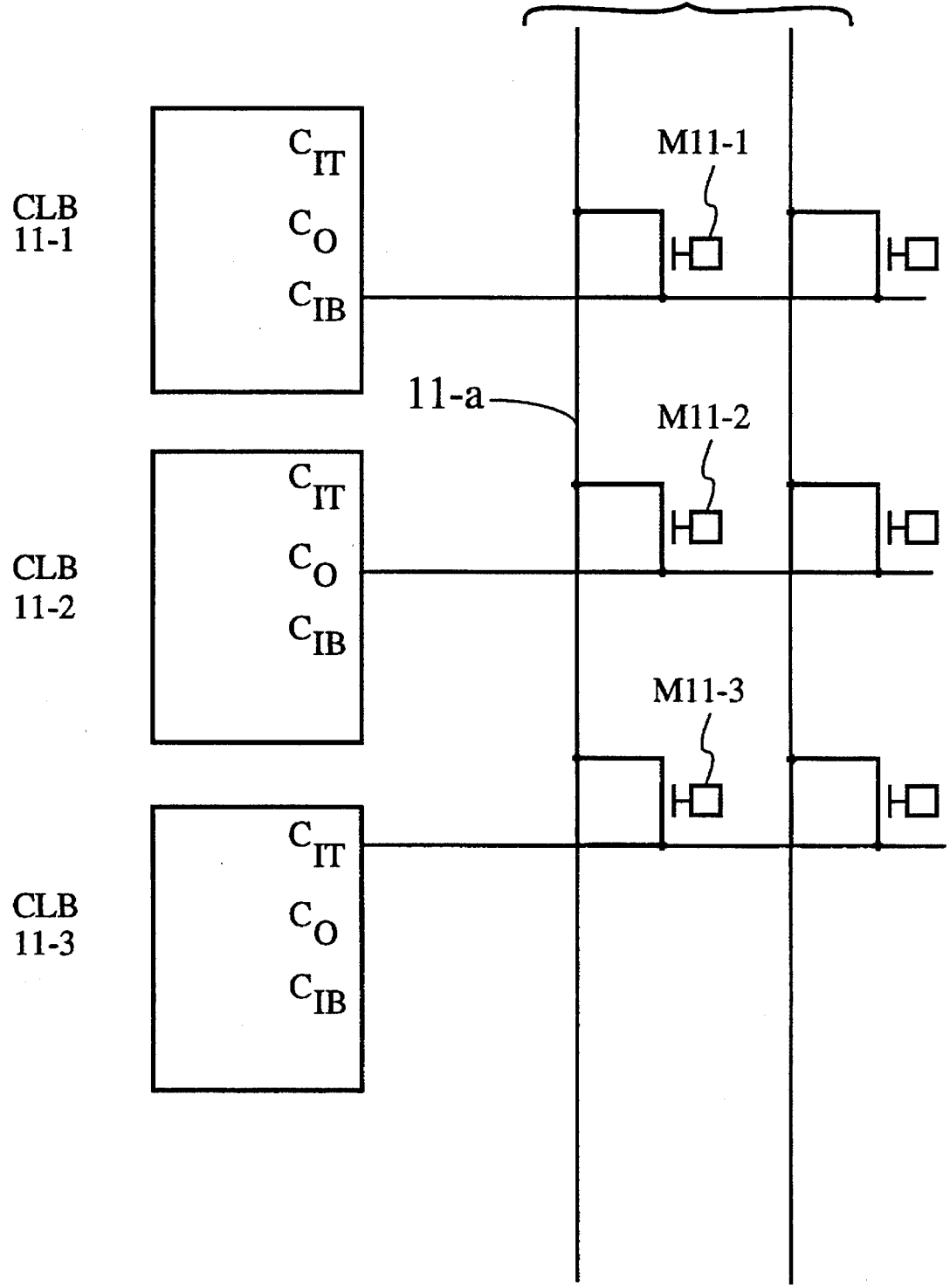
FIG. 11b is a schematic diagram showing an example of carry interconnect circuitry implemented with programmable interconnects.

FIG. 11b shows an interconnect structure which does not use dedicated interconnect circuitry for propagating signals in a choice of directions through an array. FIG. 11b shows only a partial set of memory cells and interconnects which would be needed in the interconnect structure for interconnecting logic blocks to form a multi-bit adder or other multi-bit function that uses carry logic. According to FIG. 11b, output $C_0$ of logic block 11-2 can be connected to either logic block 11-1 or logic block 11-3 by turning on a corresponding transistor controlled by memory cell M11-2 which connects the output of logic block 11-2 to interconnect line 11-a. If it is desired to connect output $C_0$ of logic block 11-2 to input $C_{IB}$ of logic block 11-1, memory cell M11-1 is programmed to turn on its corresponding transistor so that the signal on line 11-a will propagate to terminal $C_{IB}$ of block 11-1. If it is desired to connect output $C_0$ to logic block 11-3, the transistor controlled by memory cell M11-3 is turned on to connect interconnect line 11-a to input $C_{IT}$ of logic block 11-3. Other memory cells (not shown) can likewise be programmed to control the direction of signal propagation from one logic block to the next. It is easy to see that a large number of memory cells is needed in order to provide flexibility in controlling the propagation direction of the carry signal through the stages of a multi-bit adder.

Figure 11C:
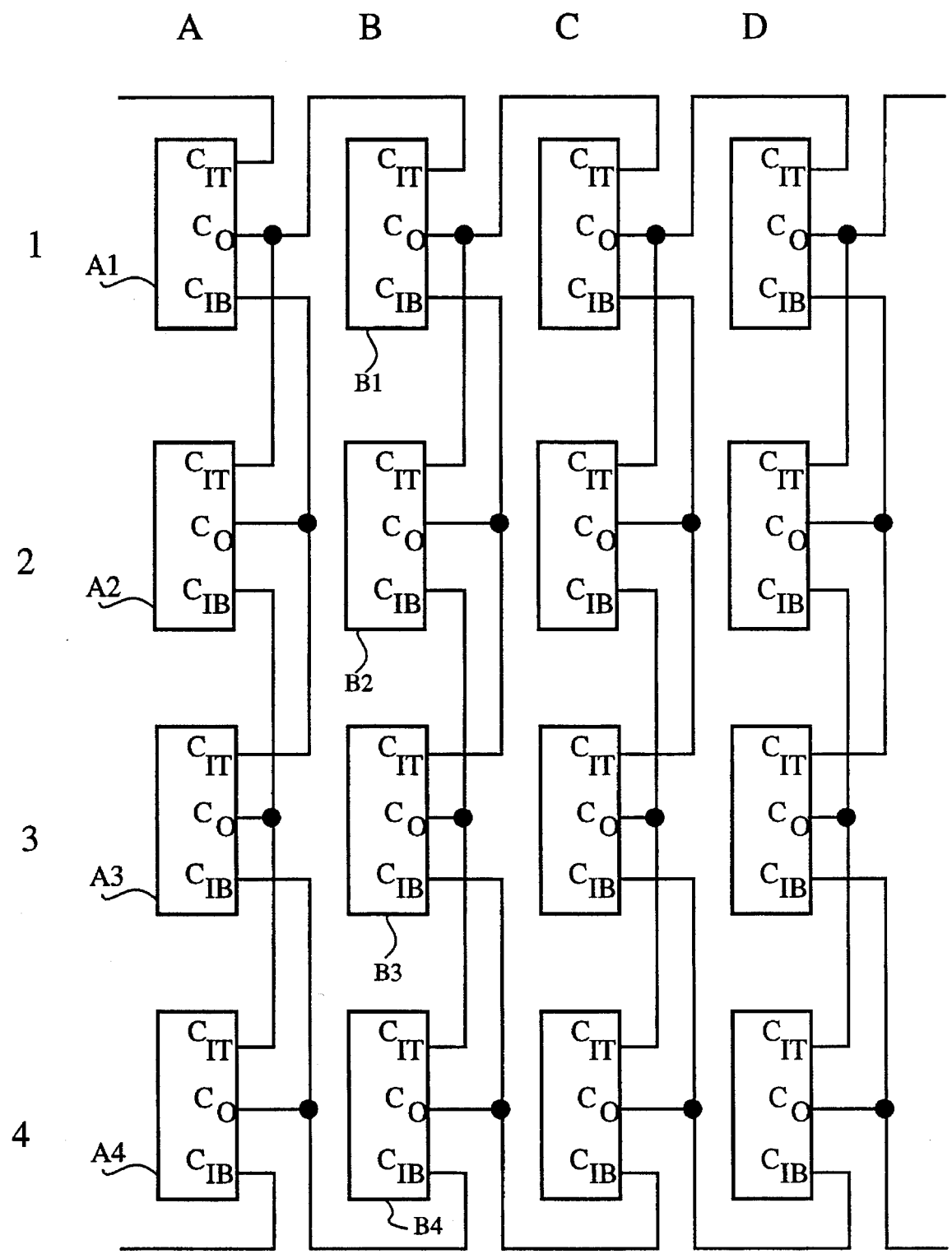
FIG. 11c is a schematic diagram showing one embodiment of dedicated carry logic interconnect circuitry.

Another circuit shown in FIG. 11c exhibits more sophisticated dedicated carry interconnect circuitry. This dedicated interconnect circuitry allows a carry chain to be built in a serpentine fashion of arbitrary length. Some of the blocks are configured as in FIG. 11a, that is, such that the carry-out signal is propagated to both the logic block above and the logic block below. However, at the top and bottom edges of the array, the circuits are configured differently. At the top edge, the carry-out signal of a logic block is propagated to the carry-in of the logic block below, and to the carry-in of the logic block to the right. Further, each top logic block receives a carry-in signal from the logic block below and from the logic block to the left. Each circuit on the bottom is configured such that the carry-out signal of a logic block is propagated to the carry-in of the logic block above, and to the carry-in of the logic block to the right. Further, each bottom circuit receives a carry-in signal from the logic block above and from the logic block to the left. Memory cell MC of each logic block controls which carry-in signal of the two available carry-in signals will be received by the logic block as discussed in connection with FIG. 11a.

The sophisticated dedicated interconnect circuitry shown in FIG. 11c is especially useful in providing increased flexibility in design layouts. Multi-bit adders or counters, or other multi-bit arithmetic functions, need not be restricted to a particular column of logic blocks. For example, an eight-bit counter can be implemented in the horseshoe configuration consisting of logic blocks B3, B4, A4, and A3, where A3 will contain the least significant bit and the next more significant bit, A4 the next two more significant bits, B4 the next, and finally, B3 the two most significant bits. The memory cells MC (FIG. 10) of each block will be programmed such that the carry signal will propagate from $C_0$ of logic block A3 to $C_{IT}$ of logic block A4, then from $C_0$ of logic block A4 to $C_{IB}$ of logic block B4, and finally from $C_0$ of logic block B4 to $C_{IB}$ of logic block B3. Since the internal circuitry of the logic blocks (as shown in FIG. 10) allows the carry logic of any particular bit(s) to be bypassed, the eight-bit counter (or other function using carry logic) need not be realized in adjacent blocks. So, for example, the least significant bits could be in logic block A2 instead of A3, with the other six bits being in A4, B4, B3 as in the previous example. By appropriately programming the memory cells CL2, and CL3 and CL6 in block A3, the carry signal $C_0$ of logic block A2 will bypass the carry logic of logic block A3, and propagate to $C_{IT}$ of logic block A4.

Carry Logic Circuits According to the Present Invention

Figure 12A:
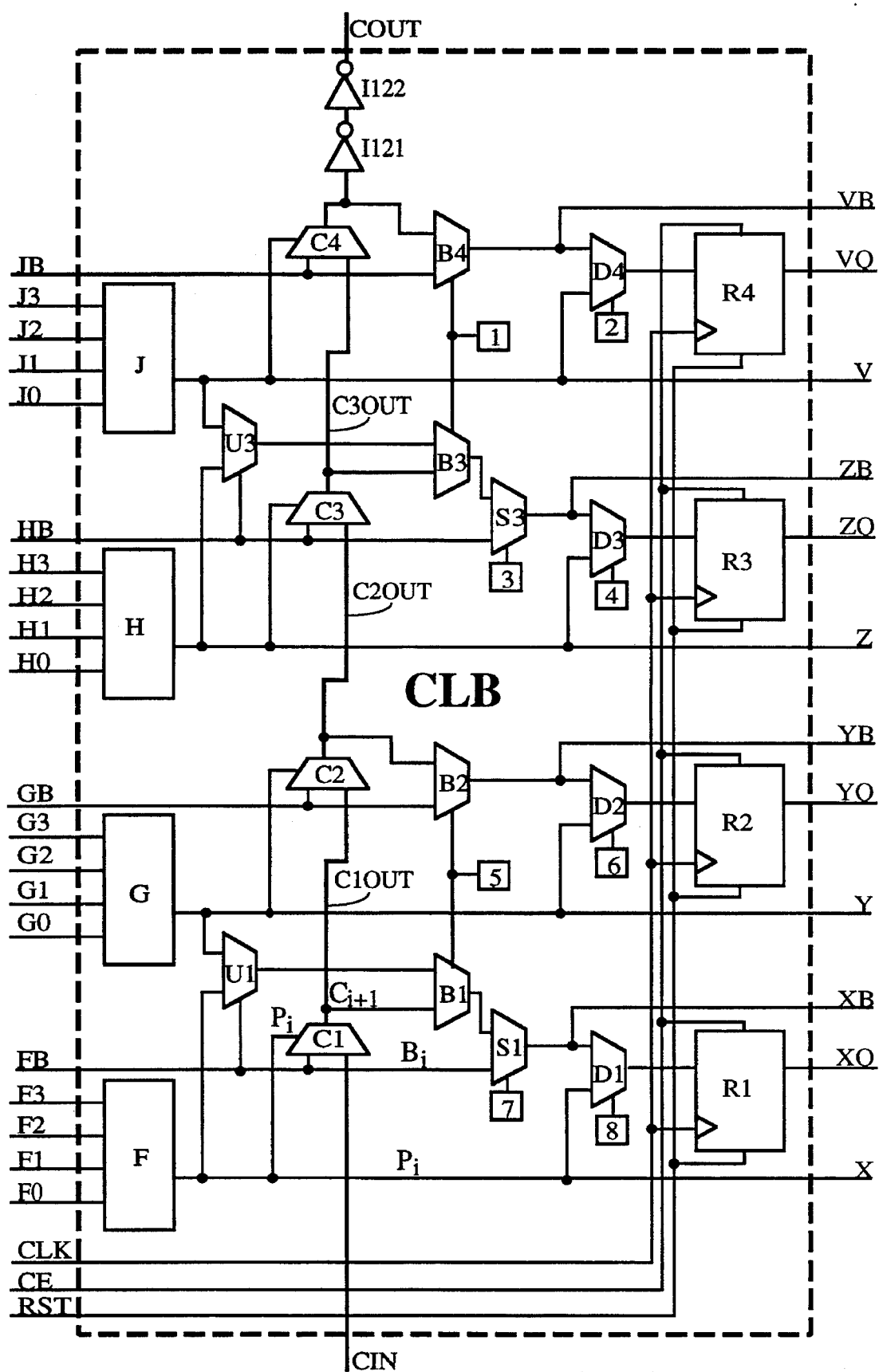
FIG. 12a shows a schematic diagram of a configurable logic block (CLB) in accordance with the invention, having four stages, which implements the circuit of FIG. 8b when combined with another CLB for computing the sum.

FIG. 12a illustrates a configurable logic block CLB which implements the embodiment of FIG. 8b. Four function generators F, G, H, and J are included in logic block CLB. Function generators F, G, H, and J each comprise look-up tables as discussed above in connection with FIGS. 9a through 9d. Thus, each function generator provides any function of the input signals F0 through F3, G0 through G3, H0 through H3, and J0 through J3 respectively. To implement an arithmetic function of input variables A and B, one bit is handled in each of the function generators. For example, the lowest order sum bit $S_0$ may be calculated from the lowest order bits of A and B, namely bits $A_0$ and $B_0$, in the F function generator. Bit $A_0$ is provided to both the FB input terminal and to an input terminal F0, F1, F2, or F3 of the F function generator. Bit $B_0$ is provided to another terminal of the F function generator or generated within the function generator as a function of the other inputs. For performing addition, a logical 0 is provided on carry-in line CIN. Likewise, bits $A_1$ and $B_1$ are provided to the G function generator, and so forth for the higher order bits. The function generators are each programmed by loading the appropriate lookup table to generate the XOR function of the A and B bits as indicated by unit 903 of FIG. 8*b*. (As shown in FIG. 8*b*, the B input value may be generated internally to the function generator as a function of other inputs on lines not used for the A input. This is possible because the function generator may provide any function of four inputs.) Thus the function generators implement any data modification 921 and each generate XOR function 922 of the corresponding bits $A_i$ and $B_i$. This embodiment does not limit arithmetic operations to four-bit numbers because the CLB is formed as part of an array of CLBs, and higher order bits may be handled in CLBs connected above the CLB shown.

Associated with the function generators are fast carry MUXes C1, C2, C3, and C4. MUX C1 receives a carry-in signal CIN (which will be 0 if the arithmetic is addition and the F function generator is receiving the lowest order bits) and a B input signal FB, and generates an output signal C1OUT. MUX C2 receives the C1OUT signal and a second B input signal GB, and generates an output signal C2OUT. MUXes C3 and C4 are connected equivalently. MUX C4 generates the COUT signal from the logic block CLB. Function generators F, G, H, and J provide as output signals X, Y, Z, and V respectively, the respective carry-propagate signal $P_i$. These output signals control carry MUXes C1, C2, C3, and C4 as discussed in connection with FIG. 6*a*, and thus provide a cumulative carry-out function COUT.

It is necessary to provide periodic repowering of the carry signal, as was discussed in connection with inverters I101 and I102 of FIG. 10. The frequency with which repowering buffers are provided depends upon the interconnect architecture in which the invention will be used. As shown in FIG. 12*a*, a repowering buffer comprising inverters I121 and I122 is positioned every four multiplexers in the carry path, or once every CLB. In another embodiment, repowering buffers are provided every two multiplexers in the carry path, thus two repowering buffers are provided in every CLB. Of course, the invention is not limited to an architecture in which one CLB comprises four function generators. Many other variations are also possible.

The embodiment of FIG. 12*a* uses another CLB identical to the one shown but positioned adjacent, preferably to the right or left of that shown, to generate the sum $S_i$ of FIG. 8*b*. To provide the carry-propagate signal $P_i$ to the sum CLB to its left or right, MUXes B1, B2, B3, and B4 are set by their respective memory cells 1 and 5 to forward the outputs of carry MUXes C1, C2, C3, and C4. Memory cells 3 and 7 are likewise set to cause MUXes S3 and S1 to forward the outputs of MUXes B3 and B1. Thus the outputs of carry MUXes C1, C2, C3, and C4 appear at output lines XB, YB, ZB, and VB. In the sum CLB to the right or left of the carry CLB, output XB is connected to line FB and one of inputs F0 through F3. Output X is connected to another of inputs F0 through F3. Equivalent connections are made to the G, H, and J function generators. In the sum CLB, function generators F, G, H, and J then provide the sum outputs for successive bits.

Figure 12B:
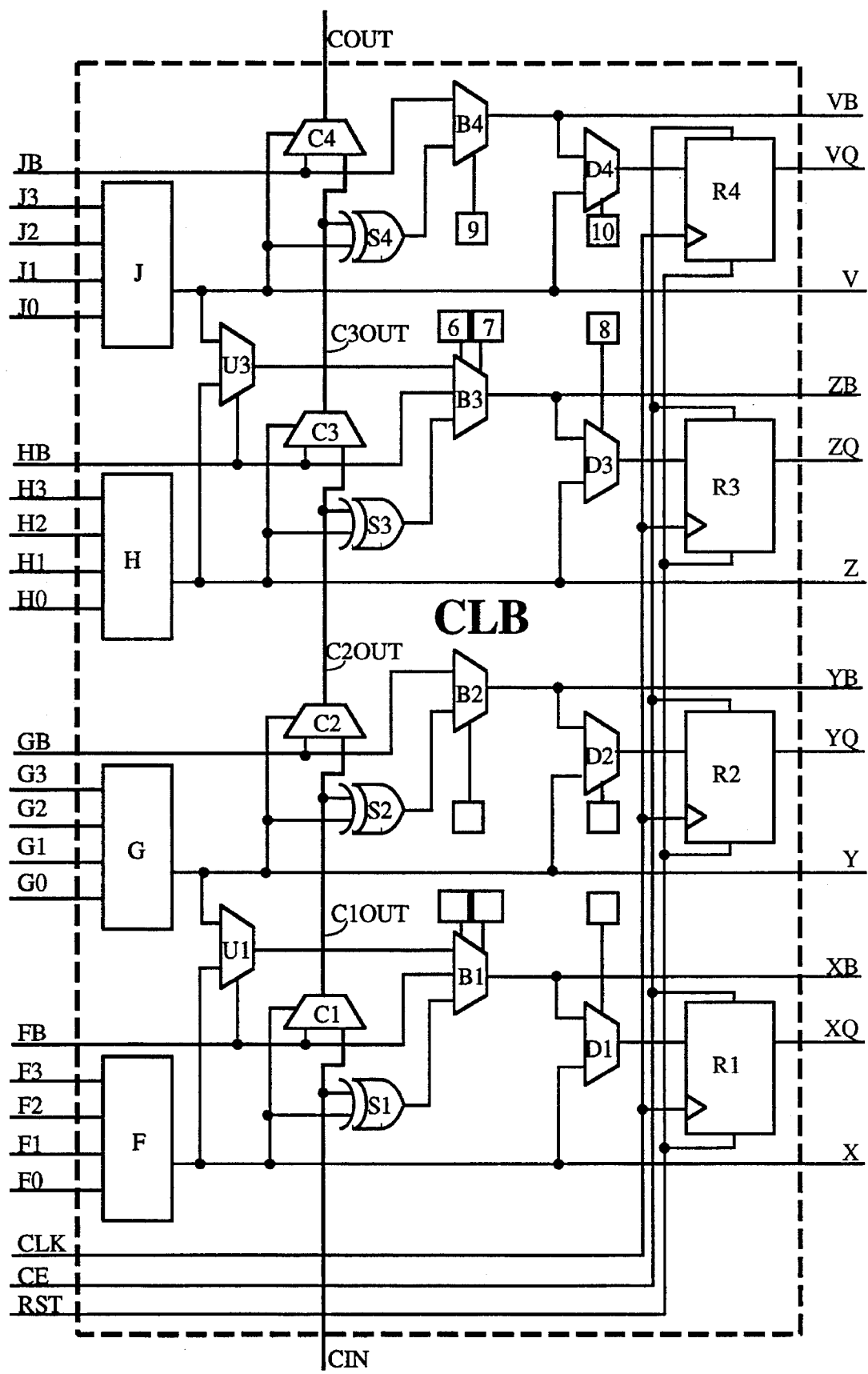
FIG. 12b shows another CLB in accordance with the invention, which implements the circuit of FIG. 8b by using dedicated hardware for computing the sum.

FIG. 12*b* shows another embodiment of the invention which requires only a single function generator per bit. The CLB of FIG. 12*b* is similar to that of FIG. 12*a*, but includes XOR gates S1 through S4 for calculating the sum.

In the embodiment of FIG. 12*a*, a single memory cell 1 controls both of MUXes B3 and B4, while in the embodiment of FIG. 12*b*, MUX B4 is controlled by memory cell 9 and MUX B3 is a three-input MUX controlled by memory cells 6 and 7. And, as discussed, in the embodiment of FIG. 12*a* the carry and sum of one bit are calculated in two different CLBs while in the embodiment of FIG. 12*b*, XOR gates S1 through S4 allow both the carry and sum to be calculated in a single CLB. Thus the embodiment of FIG. 12*b* is more efficient for implementing arithmetic functions and the embodiment of FIG. 12*a* has higher density and therefore lower cost per CLB. Many other variations are of course possible. For example, in FIG. 12*b*, memory cell 9 may control MUX B3 and also replace one of memory cells 6 and 7 to provide one control to MUX B4, thus saving a memory cell. In another embodiment, one memory cell may activate the carry mode in all four memory cells B1 through B4.

Note that in the embodiments of FIGS. 12*a* and 12*b*, there is no need for the multiplexers M1, M3, and M4 of FIG. 10, or for the related configuration memory cells for configuring multiplexers M1, M3, and M4. Note also that in contrast to FIG. 10, the function generator inputs, for example F0 through F3 are fully swappable. An input signal may be directed to any selected one of these inputs. This interchangeability may be an advantage when routing the signals through the interconnect structure, to be discussed below. Note also, that in FIGS. 12*a* and 12*b*, any data modifying logic (see data modification unit 921 in FIG. 8*b*) is completely user-selectable, and is not restricted by having to place arithmetic inputs onto particular pins. Thus, the software which routes the user's design finds a route more easily, and the route typically requires a shorter path. Further, in comparing the invention as illustrated in FIG. 8*b* to the device of FIG. 8*a*, the device of FIG. 8*a* requires that the $A_i$, $B_i$, and $C_i$ inputs be provided to the function generator 902, thus limiting the number of additional inputs to one. By contrast, the embodiment of FIG. 8*b* can accommodate in data modification function 921 any function of three variables. If the sum $S_i$ is calculated in another function generator 904, that function generator may modify the $S_i$ function in data modification area 927 by any function of two additional inputs.

Routing Architecture in Which Carry Circuit May Be Used

Figure 12C:
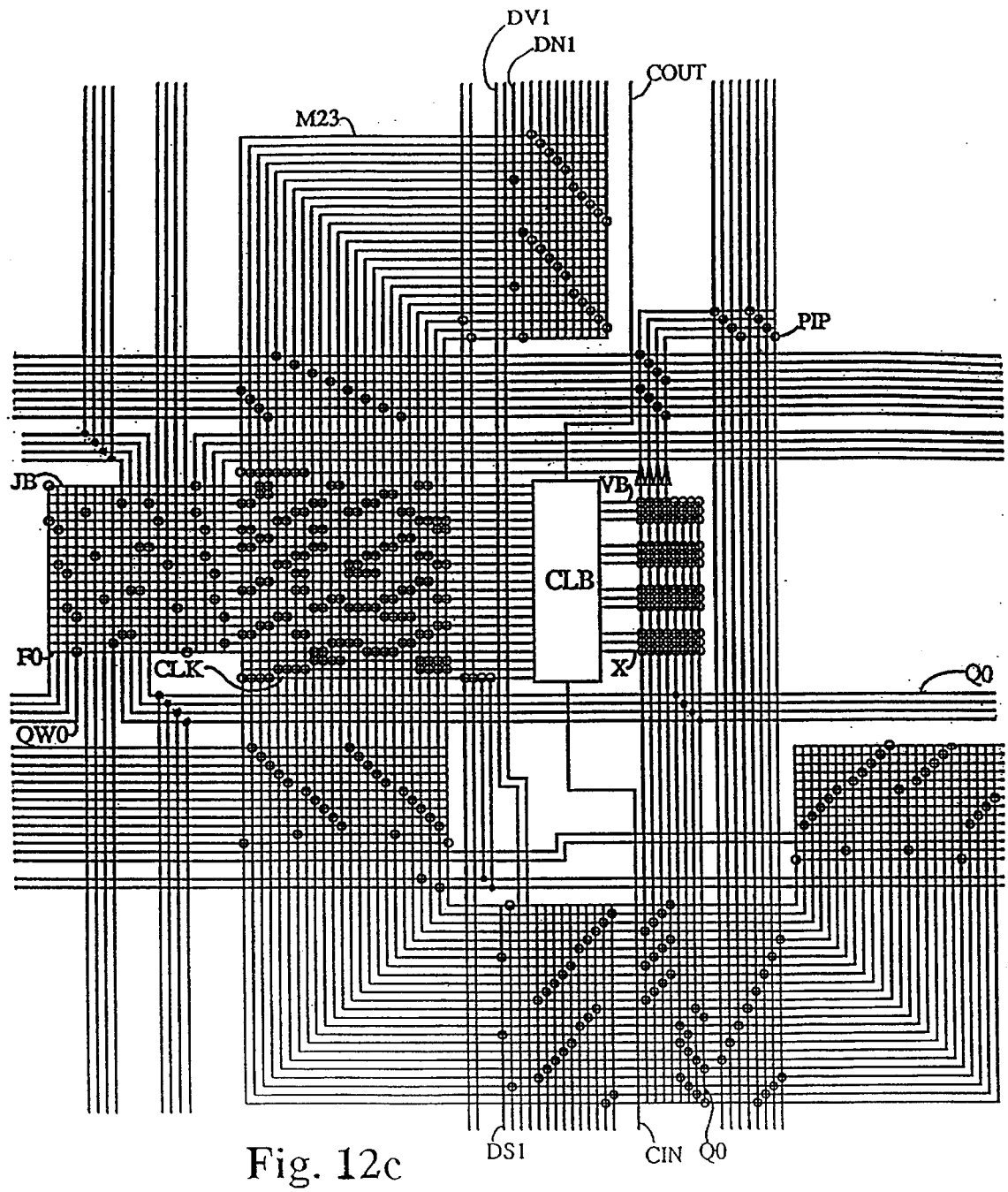
FIG. 12c shows a tile which combines the CLB of FIG. 12a or 12b with interconnect routing for interconnecting an array of CLBs.
Figure 12D:
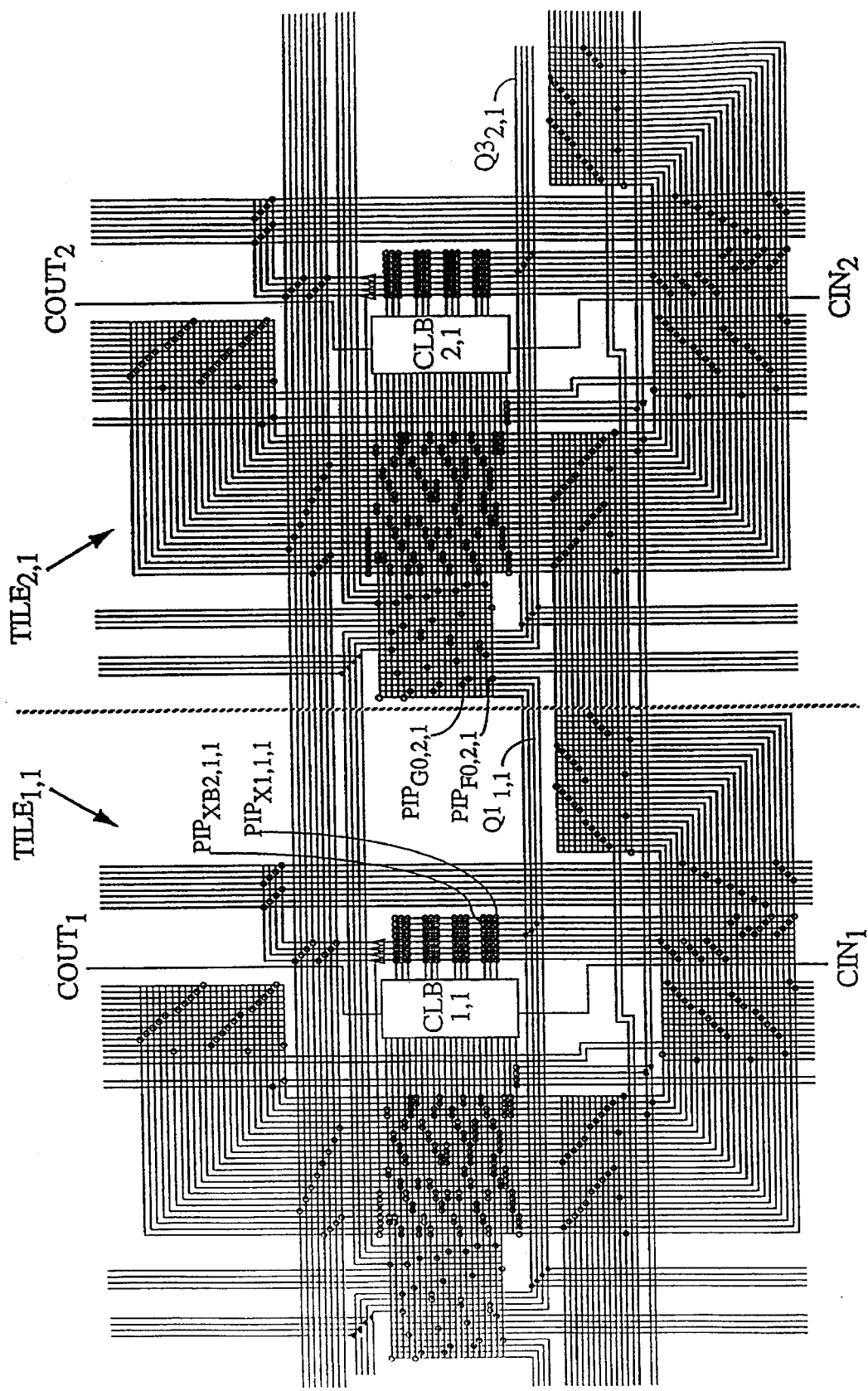
FIG. 12d shows two of the tiles of FIG. 12c connected together horizontally.

An architecture for routing signals from one CLB to another is illustrated in FIGS. 12*c* and 12*d*. FIG. 12*c* shows a tile which combines logic and routing. FIG. 12*d* shows two horizontally adjacent tiles, $TILE_{1,1}$ and $TILE_{2,1}$ connected together as they are when forming a chip such as shown in FIG. 12*e*. Lines extending to the right in $TILE_{1,1}$ are shown to line up with and connect to lines extending to the left in $TILE_{2,1}$. The core tile of FIG. 12*c* also includes lines at the top and bottom of the tile. When placed one above the other, these top and bottom lines also connect. In a complete integrated circuit chip, the tiles of FIG. 12*c* are combined to form a structure such as shown in FIG. 12*e*, where elements C comprise core tiles, elements N, S, E, and W comprise north, south, east, and west edge tiles for input and output to the chip, and elements NW, NE, SW, and SE comprise corner tiles for additional chip input and output. Dividers such as DS and DC allow adjoining conductive lines to be programmably connected or not connected.

With respect to FIG. 12*c*, the CLB of FIG. 12*a* or 12*b* is shown near the center of the figure. Input lines JB through CLK positioned at the left of FIGS. 12*a* and 12*b* are also positioned correspondingly at the left of the CLB of FIG. 12*c*. For simplicity, only lines JF, F0, and CLK are labeled. As in FIG. 12*a* or 12*b*, carry-in input line CIN extends from the bottom of the drawing into the CLB, and carry-out line COUT extends out from the top of the drawing. Output lines VB through X extend from the right of the CLB in FIGS. 12a and 12b, and also in FIG. 12c. In FIG. 12c, only lines VB and X are labeled. Also shown in FIG. 12c are 24 input select lines M0 through M23, of which only M23 is labeled for simplicity. Lines M0 through M23 select input signals from tiles to the north, south, east, and west for input to the CLB. Many small open circles are shown in FIG. 12c. Each represents a programmable interconnect point or PIP, which, by means of a transistor, several transistors, an antifuse, an EPROM cell, or other means can be programmed to electrically connect the horizontal line and vertical line crossing within the circle. For simplicity, only one PIP has been labeled. Also shown in FIG. 12c are hard connections, each represented by a black dot. CLB output lines VB through X can be programmably connected by a PIP to one of the lines, for example Q0 having hard connections.

Looking at FIG. 12d, the propagate signal $P_i$ on the X output of the F function generator of $CLB_{1,1}$ in tile $TILE_{1,1}$ can be connected by $PIP_{X1,1,1}$ to direct interconnect line $Q0_{1,1}$, which extends into tile $TILE_{2,1}$ and can be connected by $PIP_{FO4,2,1}$ to the FO input of $CLB_{2,1}$. As shown in FIG. 12a, the carry-out signal $C_{i+1}$ from fast carry MUX C1 is connected through multiplexers B1 and S1 to the XB output of $CLB_{1,1}$. $PIP_{XB2,1,1}$ connects to another direct connect line $Q1_{1,1}$ which connects through $PIP_{GB3,2,1}$ to input line G0 of the G function generator of $CLB_{2,1}$. This serves as the carry-in input $C_i$ for the next sum bit to be calculated in the G function generator of $TILE_{2,1}$. Higher order bits are connected correspondingly. Thus the propagate and fast-carry functions occur in $TILE_{1,1}$ and the sum function occurs in $TILE_{2,1}$.

The full interchangeability of pins F0 through F3 may have one of two beneficial effects. In the embodiment of FIG. 12d, a low number of PIPs can provide sufficient interconnectability. Since each PIP requires about six transistors, reducing the number of PIPs reduces the size of the chip. Alternatively, if more PIPs are provided, a fast route for all function generator inputs is generally available, and therefore the chip operation is faster.

Additional Functionality

When not being used for the carry function in an arithmetic operation, the carry multiplexers C1 through C4 of FIG. 12a or 12b can be used for generating the AND and OR function as well as certain other functions. For example, by placing a logical 0 on line FB of FIG. 12a, multiplexer C1 is programmed to generate the AND function of the X output signal of the F function generator and the carry-in signal CIN. By placing a logical 1 on line FB, multiplexer C1 is programmed to generate the OR function of the complement of the X output signal and the carry-in signal CIN.

Circuit Which Provides Both Carry Logic and Other Logic

Figure 13:
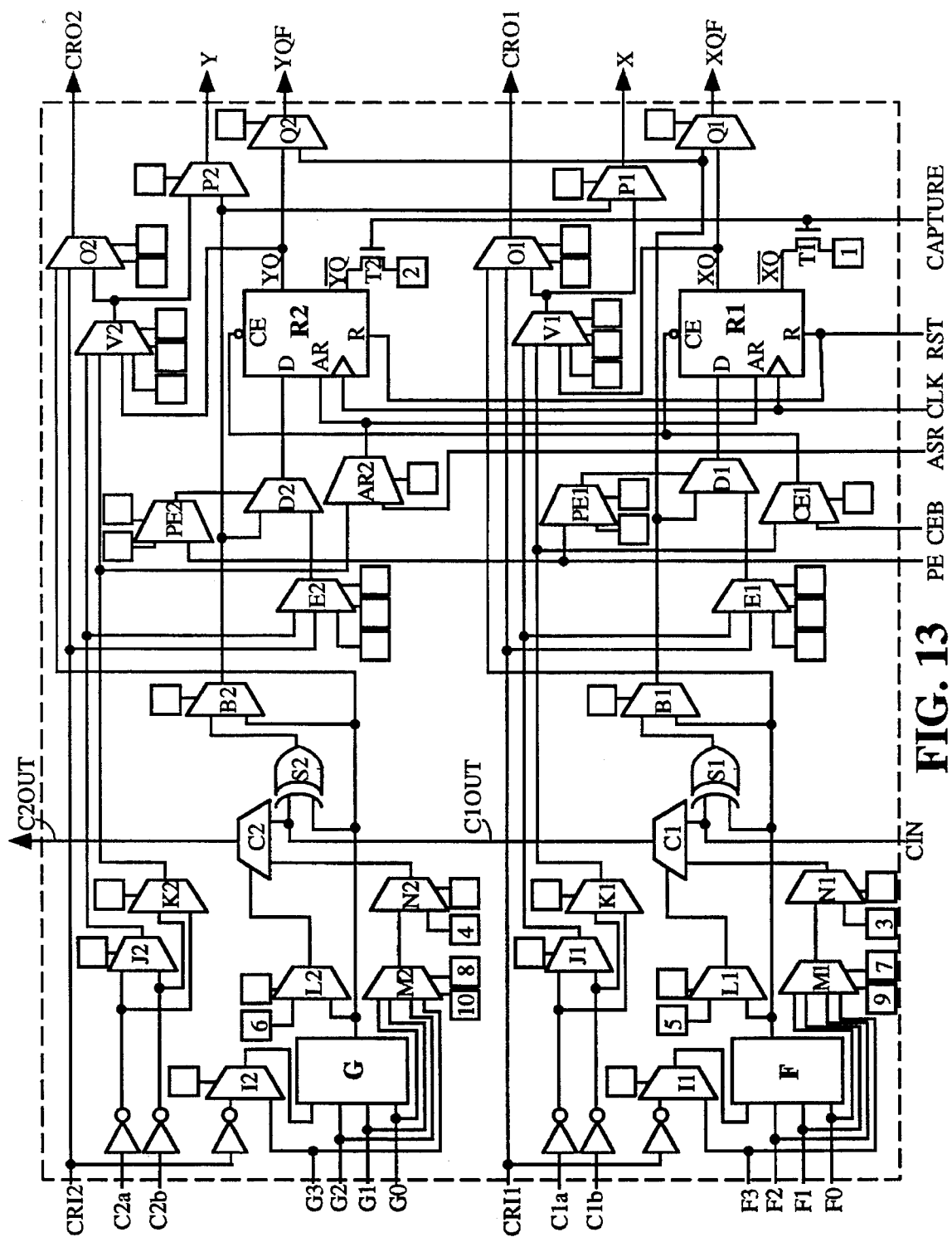
FIG. 13 shows a CLB in accordance with the invention which implements the circuit of FIG. 8c.

FIG. 13 illustrates a configurable logic block CLB which implements the embodiment of FIG. 8c. Two function generators F and G are included in the logic block of FIG. 13. Function generators F, G each comprise look-up tables as discussed above in connection with FIGS. 9a through 9d. Thus, each function generator provides any function of the input signals F0 through F3, or G0 through G3. As in FIG. 12a or 12b, to implement an arithmetic function, one bit is handled in each of the function generators. Multiplexers N1 and N2 are set to forward the values from M1 and M2 to input terminals of carry multiplexers C1 and C2. Similarly, multiplexers L1 and L2 are set to forward the outputs of function generators F and G to the control terminals of carry multiplexers C1 and C2. In this mode, the components of FIG. 13 behave as corresponding components in FIGS. 12a and 12b.

However, multiplexers L1, L2, M1, M2, N1, and N2 offer additional functionality in use of the carry multiplexers C1 and C2. Multiplexers L1 and L2 can be set to provide a constant value stored in memory cells 5 and 6. The value stored in cell 5 or 6 can cause carry multiplexers C1 and C2 to select the output of multiplexers N1 and N2. When multiplexers N1 and N2 are set to provide a constant value 1 from cells 3 and 4, carry multiplexers C1 and C2 provide the OR function of the carry-in signal and the value from multiplexers L1 and L2. When multiplexers N1 and N2 are set to provide a constant value 0 from cells 3 and 4, carry multiplexers C1 and C2 provide the AND function of the carry-in signal and the value from multiplexers L1 and L2. Thus wide AND or wide OR functions can easily be generated. Multiplexers M1 and M2 select one of the input signals to the F and G function generators to apply as an input signal to multiplexers N1 and N2 respectively. Memory cells 7 and 9 control multiplexer M1 and memory cells 8 and 10 control multiplexer M2. Thus the functions listed above in TABLE I can be generated by the structure of FIG. 13 while other functions are being simultaneously generated in the F and G function generators.

It can be seen in FIG. 13 that multiplexers L1 and L2 allow carry multiplexers C1 and C2 to be used for skipping and initialization while the function generators are used for other purposes. Multiplexers N1 and N2 allow initialization and logic functions without using up one of the function generator input signals and the routing thereto (not shown, positioned to the left of the figure, for example).

Another embodiment similar to FIG. 13 includes a fifth input to the structure comprising multiplexers M1 and N1 (and their equivalents M2 and N2). If desired, the fifth signal is provided as the output of N1. This embodiment has the advantage that the functions of TABLE I can be implemented while the related function generator F is able to simultaneously implement any function of the four input signals F0–F3 which it receives.

Applications of the Circuit of FIG. 13

TABLE I lists functions which can be implemented with the circuit of FIG. 8c. In FIG. 13, multiplexers M1 and M2 also allow for selection from four function generator input signals F0–F3 and G0–G3 to provide as input to the carry multiplexers C1 and C2. Multiplexers M1 and M2 allow lines FB and GB of FIG. 12B to be eliminated. Depending upon layout, this may save chip area. In any case, multiplexers M1 and M2 increase flexibility by allowing any of signals F0–F3 and G0–G3 to be used as carry input signals.

By setting multiplexers so that carry multiplexer C1 receives one of the input signals F0–F3, it is possible to gang the carry input signal from another part of the integrated circuit chip.

Providing multiplexers N1 and N2 in the path from the function generator input signals F0–F3 and G0–G3 allows a carry signal to be initiated (with a fixed value) without using up the related function generator.

Dynamically Switchable Difference/Identity Comparator

Users sometimes want to dynamically switch between having a difference comparator and having an identity comparator. In a difference comparator, if a 3 is compared to a 2, the difference 3-2 is positive. The subtraction is accomplished by inverting one input and adding, which is accomplished by an XOR gate with one inverted input for each bit of the subtraction.

Figure 14:
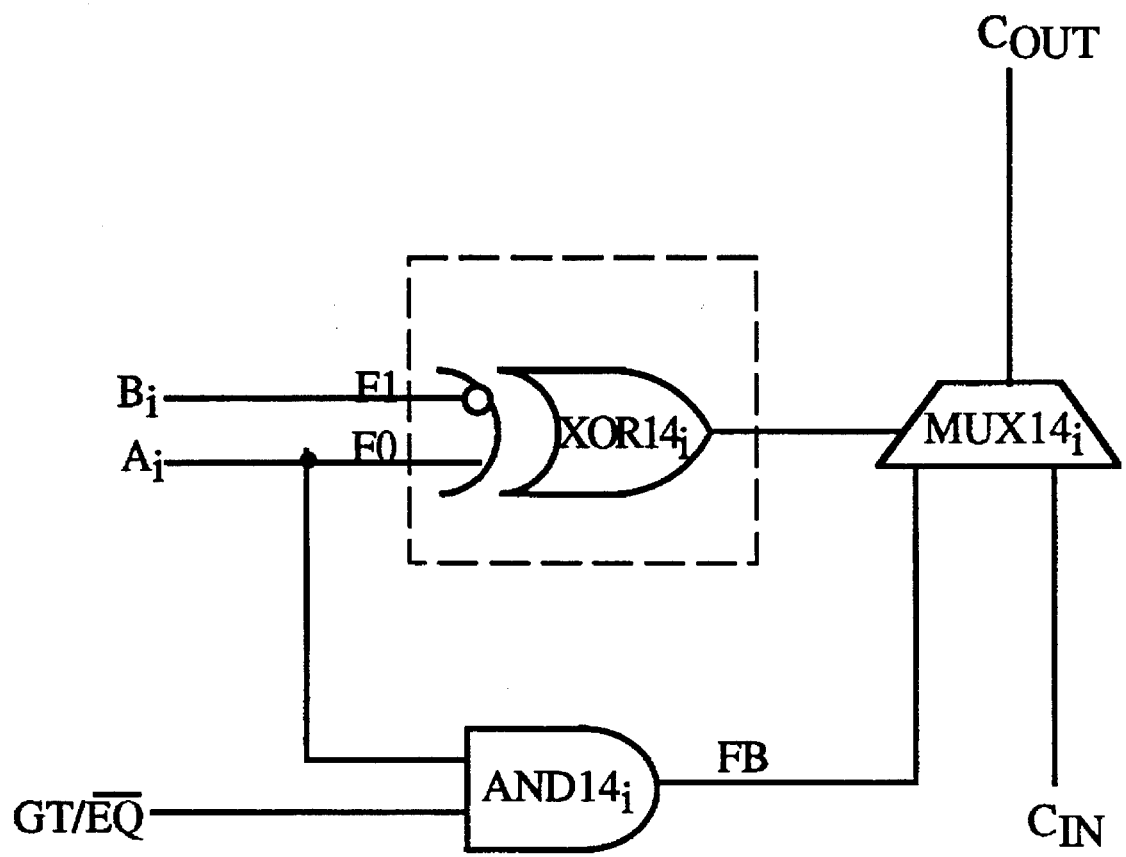
FIG. 14 shows a dynamically switchable comparator circuit which may be implemented by the circuit of FIG. 12b or FIG. 13.

FIG. 14 shows a circuit which a user may want to implement that dynamically switches between being a difference comparator and being an identity comparator. This circuit is efficiently implemented by the structure of either FIG. 12b or FIG. 13 plus one outside AND gate. To subtract two numbers A–B, the GT$\sqrt{\text{EQ}}$ signal is set to logic 1 and a logic 1 is provided on the lowest order carry-in terminal $C_{in}$. Thus for each bit $A_i$ and $B_i$ of two numbers A and B, AND gate AND14$_i$ forwards $A_i$. Thus FB=$A_i$ (FIG. 12b) or F3=$A_i$ (FIG. 13), and what we have is subtraction. The result of the carry chain output from the highest order bit determines which input was greater.

To determine if two numbers A and B are equal, GT$\sqrt{\text{EQ}}$ is set to 0, which causes the carry chain to do a bit-by-bit comparison and create the AND of the individual bits. Only if all bits are equal is the output a 1. So the external AND gate lets you switch between the two functions by providing $A_i$ or O to the zero input of multiplexer MUX14$_i$. Since the function changes in response to the input signal GT$\sqrt{\text{EQ}}$ it is easy for a user to dynamically change between the subtraction and identity functions by changing this signal.

The circuit of FIG. 14 can be implemented in the architecture of FIG. 12b by providing one AND gate for each bit to implement AND gate AND14$_i$ in a function generator not shown, for example in function generators to the left of function generators F, G, H, and J and applying the outputs of these AND gates to lines FB, GB, HB, and JB as well as to additional function generators not shown which may be above or below those shown in FIG. 12b for additional bits in the numbers A and B being compared. Bits of the two numbers A and B are then applied to the F0 and F1 input terminals of the F, G, H, and J function generators, which are programmed to provide the XOR function with the F1, G1, H1, and J1 inputs inverted. Multiplexers C1, C2, C3, and C4 plus equivalent multiplexers in adjacent logic blocks are programmed to be controlled by the output signals of the F, G, H, and J function generators. Thus the circuit of FIG. 14 is implemented, and the function of the circuit is determined by the GT$\sqrt{\text{EQ}}$ signal.

Implementation of FIG. 14 in the circuit of FIG. 13 is similar to implementation in the circuit of FIG. 12b. In FIG. 13, the output of AND gates 14$_i$ are provided to one of the function generator inputs, say F3 and G3, and multiplexers M1 and M2 are set to forward that signal to multiplexers N1 and N2, which provide the signal to carry multiplexers C1 and C2.

Summary

Several embodiments of the invention have been described in detail in connection with FIGS. 12a, and 12b, and 13. Other embodiments of the present invention incorporating the features taught here will become obvious to those skilled in the art in light of the above disclosure. For example, it is possible to interconnect logic blocks which are not contiguous. Further, although FIGS. 12a and 12b show a logic block having four stages of carry logic and four function generators, and FIG. 13 shows a logic block having two stages of carry and other logic and two function generators, it is possible to form logic blocks having other numbers of stages and other hardware for generating common functions.

For another example, although the control circuitry of FIGS. 12a and 12b are described as controlled by memory cells, it is obvious that these memory cells can be SRAM memory cells, EPROMS, EEPROMS, flash memory cells, fuses, or antifuses. It is also obvious that control signals can be provided by output signals of logic gates and other available signals. These embodiments and others which become obvious in light of the above disclosure are intended to fall within the scope of the present invention.

We claim:

1. A programmable logic device comprising an array of logic blocks, each logic block having at least one circuit comprising:

an input terminal for providing a first input signal ($A_i$);

a ripple-in terminal ($C_i$) and a ripple-out terminal ($C_{i+1}$);

a ripple-chain multiplexer (923) for connecting one of said input terminal and said ripple-in terminal to said ripple-out terminal;

a lookup table (903) for generating a function of said first input signal and at least one other input signal; and a control multiplexer (804) for controlling said ripple-chain multiplexer, said control multiplexer being controlled to select from at least two input signals, one of said signals being provided by said lookup table.

2. A programmable logic device comprising an array of logic blocks, each logic block having at least one circuit comprising:

an input terminal for providing a first input signal ($A_i$);

an input select multiplexer (801) for providing one of said first input signal and another signal (802) as an output of said input select multiplexer;

a ripple-in terminal ($C_i$) and a ripple-out terminal ($C_{i+1}$);

a ripple-chain multiplexer (923) for connecting one of said output of said input select multiplexer and said ripple-in terminal to said ripple-out terminal;

a lookup table (903) for generating a signal which can control said ripple-chain multiplexer.

\* \* \* \* \*

UNITED STATES PATENT AND TRADEMARK OFFICE
CERTIFICATE OF CORRECTION

PATENT NO. : 5,481,206
DATED : January 2, 1996
INVENTOR(S) : Bernard J. New and Kerry M. Pierce It is certified that error appears in the above-identified patent and that said Letters Patent is hereby corrected as shown below:

Col. 1, line 61, "$(A_i \otimes B_i)$" should read --$(A_i @ B_i)$--.

Col. 2, line 32, "$2_{n+1}$" should read --$2n + 1$--.

Col. 2, line 46, "$P_{i=Ai} @ B_i$" should read --$P_i = A_i @ B_i$--.

Col. 5, line 50, "is comprising FIGS. 4A through 4D" should read --comprising FIGS. 4A through 4D is--.

Col. 7, line 60, "Device" should read --Devices--.

Col. 15, line 24, "CLOUT" should read --C1OUT--.

Col. 19, lines 6, 13-14, 20, and 40, "$GT\sqrt{\overline{EQ}}$" should read --$GT/\overline{EQ}$--.

Signed and Sealed this

Fourth Day of March, 1997

BRUCE LEHMAN

*Attest:*

*Attesting Officer*   Commissioner of Patents and Trademarks